United States Patent
Sim et al.

(10) Patent No.: US 10,991,727 B2
(45) Date of Patent: Apr. 27, 2021

(54) LIGHT EMITTING DISPLAY DEVICE

(71) Applicant: LG Display Co., Ltd., Seoul (KR)

(72) Inventors: Dongmin Sim, Paju-si (KR); Kangju Lee, Paju-si (KR); Jintae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/547,224

(22) Filed: Aug. 21, 2019

(65) Prior Publication Data

US 2020/0075634 A1 Mar. 5, 2020

(30) Foreign Application Priority Data

Aug. 30, 2018 (KR) ........................ 10-2018-0103000

(51) Int. Cl.
*H01L 27/12* (2006.01)
*H01L 27/32* (2006.01)

(52) U.S. Cl.
CPC .......... *H01L 27/124* (2013.01); *H01L 27/326* (2013.01); *H01L 27/3246* (2013.01); *H01L 27/3276* (2013.01)

(58) Field of Classification Search
CPC ............... H01L 27/326; H01L 27/3246; H01L 27/3283; H01L 27/3295; H01L 33/20–24; H01L 33/38; H01L 51/5209; H01L 51/5225; H01L 51/5262; H01L 51/5268; H01L 51/5271; H05B 33/22; H05B 33/26; H05B 33/28
See application file for complete search history.

(56) References Cited

U.S. PATENT DOCUMENTS

| | | | | |
|---|---|---|---|---|
| 4,774,435 A | * | 9/1988 | Levinson | H05B 33/12 313/509 |
| 5,485,055 A | * | 1/1996 | Keyser | H05B 33/10 313/500 |
| 7,176,621 B2 | * | 2/2007 | Do | H01L 51/5271 313/498 |
| 10,181,574 B2 | * | 1/2019 | Koo | H01L 27/322 |
| 2006/0009133 A1 | * | 1/2006 | Hashimoto | H01L 27/3246 451/29 |
| 2008/0122347 A1 | * | 5/2008 | Lee | H01L 51/5262 313/504 |
| 2014/0261677 A1 | | 9/2014 | Sakamoto et al. | |
| 2015/0263235 A1 | * | 9/2015 | Shin | H01L 27/1237 257/72 |
| 2015/0380466 A1 | | 12/2015 | Koo et al. | |

(Continued)

*Primary Examiner* — Scott B Geyer
(74) *Attorney, Agent, or Firm* — Seed IP Law Group LLP

(57) ABSTRACT

Disclosed is a light emitting display device that can enhance light extraction efficiency of light which is emitted from a light emitting element. The light emitting display device includes: an uneven portion that is provided on a substrate and includes a plurality of concave portions separated from each other and protruding portions between the plurality of concave portions; and a light emitting element that is provided on the uneven portion. Each protruding portion includes a vertex portion that is provided between three neighboring concave portions and a connection portion that is connected to two neighboring vertex portions between two neighboring concave portions and has a height less than that of the vertex portions.

26 Claims, 14 Drawing Sheets

(56) References Cited

U.S. PATENT DOCUMENTS

| | | | |
|---|---|---|---|
| 2016/0155787 A1* | 6/2016 | Lee | H01L 27/3258 |
| | | | 257/72 |
| 2017/0084875 A1* | 3/2017 | Joung | H01L 27/3244 |
| 2017/0162830 A1* | 6/2017 | Hirakata | H01L 51/5281 |
| 2018/0190719 A1* | 7/2018 | Kim | H01L 51/5225 |
| 2019/0096976 A1* | 3/2019 | Jang | H01L 51/5206 |
| 2019/0165318 A1* | 5/2019 | Choi | H01L 27/3262 |
| 2019/0189966 A1* | 6/2019 | Jang | H01L 51/5225 |
| 2019/0348624 A1* | 11/2019 | Kim | H01L 27/3258 |

\* cited by examiner

LIGHT EMITTING DISPLAY DEVICE

CROSS-REFERENCE TO RELATED APPLICATIONS

This application claims the benefit of and priority to Korean Patent Application No. 10-2018-0103000, filed on Aug. 30, 2018, which is hereby incorporated by reference in its entirety as if fully set forth herein.

BACKGROUND

Technical Field

The present disclosure relates to a light emitting display device.

Description of the Related Art

Since a light emitting display device has a high response speed and low power consumption and spontaneously emits light without using a particular light source unlike a liquid crystal display device, the light emitting display device does not cause a problem in a viewing angle and thus attracts attention as a next-generation flat panel display device.

A light emitting display device displays an image by emission of light from light emitting elements including a light emitting layer interposed between two electrodes. In this case, light generated by emission of light from the light emitting elements is externally discharged through the electrodes, a substrate, and the like.

However, in such a light emitting display device, some light of light emitted from a light emitting layer is not externally discharged due to total reflection or the like at an interface between the light emitting layer and an electrode and/or an interface between the substrate and an air layer and thus light extraction efficiency decreases. Accordingly, a light emitting display device has a problem in that luminance decreases and power consumption increases due to low light extraction efficiency.

BRIEF SUMMARY

An objective of the present disclosure is to provide a light emitting display device that can enhance light extraction efficiency of light which is emitted from a light emitting element.

According to an embodiment of the present disclosure, there is provided a light emitting display device including: an uneven portion that is provided over a substrate and includes a plurality of concave portions separated from each other and protruding portions between the plurality of concave portions; and a light emitting element that is provided over the uneven portion. Each protruding portion includes: a vertex portion that is provided between three neighboring concave portions; and a connection portion that is connected to two neighboring vertex portions between two neighboring concave portions and has a height less than that of the vertex portions.

According to an embodiment of the present disclosure, there is provided a light emitting display device including: a substrate that includes a plurality of pixels having an opening area; an uneven portion that is provided in the opening area and includes a plurality of concave portions separated from each other and protruding portions between the plurality of concave portions; and a light emitting element that is provided on the uneven portion. Each opening area includes: a non-effective emission area that overlaps a bottom surface of each of the plurality of concave portions; a first effective emission area that is provided between two neighboring concave portions; and a second effective emission area that is provided between three neighboring concave portions and has luminance higher than that of the first effective emission area.

According to an embodiment of the present disclosure, there is provided a light emitting display device including: a substrate that includes a plurality of pixels having an opening area; and an uneven portion that is provided in each opening area and includes a plurality of concave portions separated from each other and protruding portions surrounding the plurality of concave portions. Each protruding portion includes: a vertex portion that is provided between three neighboring concave portions; and a ridge portion that is concave between two neighboring vertex portions.

With the light emitting display device according to the present disclosure, it is possible to enhance light extraction efficiency of light which is emitted from a light emitting element, to improve luminance, and to decrease power consumption.

In addition to the above-mentioned advantageous effects of the present disclosure, other features and advantages of the present disclosure will be described below or may be clearly understood by those skilled in the art from such description or explanation.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
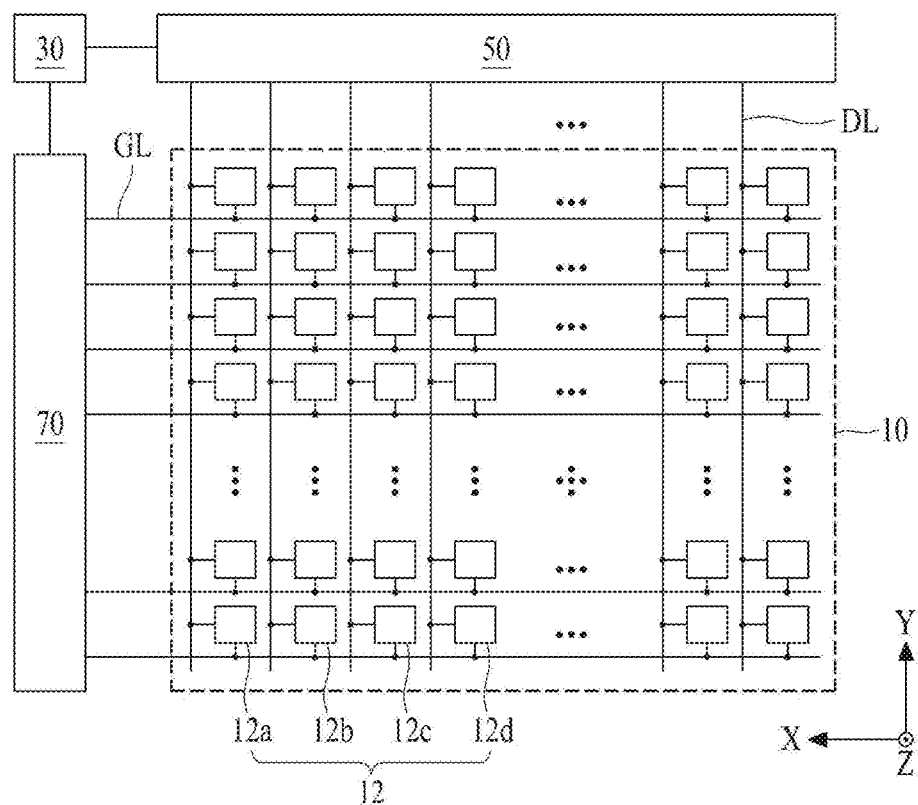
FIG. 1 is a diagram schematically illustrating a light emitting display device according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless "only" is used. The terms of a singular form may include plural forms unless referred to the contrary.

In construing an element, the element is construed as including an error range although there is no explicit description.

In describing a positional relationship, for example, when a position relation between two parts is described as "on", "over", "under", and "next", one or more other parts may be disposed between the two parts unless 'just' or 'direct' is used.

In describing a time relationship, for example, when the temporal order is described as "after", "subsequent", "next", and "before", a case which is not continuous may be included unless "just" or "direct" is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, exemplary embodiments of a light emitting display device according to the present disclosure will be described in detail with reference to the accompanying drawings. In adding reference numerals to elements in the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a diagram schematically illustrating a light emitting display device according to the present disclosure.

Referring to FIG. 1, a light emitting display device according to the present disclosure includes a pixel array unit 10, a control circuit 30, a data driver circuit 50, and a gate driver circuit 70.

The pixel array unit 10 includes a plurality of gate lines GL and a plurality of data lines DL which are provided over a substrate and a plurality of pixels 12a, 12b, 12c, and 12d that are formed in pixel areas which are defined by the plurality of gate lines GL and the plurality of data lines DL.

Each of the plurality of pixels 12a, 12b, 12c, and 12d displays an image in accordance with a gate signal which is supplied from the neighboring gate line GL and a data signal which is supplied from the neighboring data line DL.

For example, each of the plurality of pixels 12a, 12b, 12c, and 12d includes a pixel circuit that is provided in the corresponding pixel area and a light emitting element that is connected to the pixel circuit.

The pixel circuit includes at least two thin-film transistors and at least one capacitor.

The light emitting element includes a spontaneous light emitting element that spontaneously emits light in response to a data signal which is supplied from the pixel circuit and displays an image. Examples of the spontaneous light emitting element include an organic light emitting element, a quantum-dot light emitting element, and an inorganic light emitting element.

Each of the plurality of pixels 12a, 12b, 12c, and 12d may be defined as an area of a minimum unit from which light is actually emitted and may be referred to as a subpixel. In this case, at least three pixels adjacent to each other can constitute a unit pixel 12 for displaying a color image.

One unit pixel 12 according to an embodiment may include three pixels 12a, 12b, and 12c that are arranged adjacent to each other in the longitudinal direction of the corresponding gate line GL or include four pixels 12a, 12b, 12c, and 12d that are arranged adjacent to each other in the longitudinal direction of the corresponding gate line GL. For example, a first pixel 12a may be a red pixel, a second pixel 12b may be a green pixel, a third pixel 12c may be a blue pixel, and a fourth pixel 12d may be a white pixel. The light emitting elements of the first to third pixels 12a, 12b, and 12c may emit light of different colors or may emit white light. When the light emitting elements of the first to third pixels 12a, 12b, and 12c emit white light, the first to third pixels 12a, 12b, and 12c include different wavelength conversion layers (or color filter layers) that convert white light into light of different colors. The light emitting element of the fourth pixel 12d may emit white light. In this case, the fourth pixel 12d may not include a wavelength conversion layer (or a color filter layer) or may include the same wavelength conversion layer (or color filter layer) as one of the first to third pixels 12a, 12b, and 12c.

One unit pixel 12 according to another embodiment may include first to fourth pixels 12a, 12b, 12c, and 12d that are arranged adjacent to each other in the longitudinal direction of the corresponding data line DL. In such a unit pixel 12, the number of gate lines GL connected to the gate driver circuit 70 having a relatively simple circuit configuration increases, but the number of data lines DL connected to the data driver circuit 50 having a relatively complicated circuit configuration decreases.

The control circuit 30 generates pixel data corresponding to a plurality of pixels 12a, 12b, 12c, and 12d on the basis of input data. The control circuit 30 according to an embodiment may extract white pixel data on the basis of an image signal, that is, red input data, green input data, and blue input data of the unit pixel 12, calculate red pixel data, green pixel data, and blue pixel data by subtracting the extracted white pixel data from the red input data, the green input data, and the blue input data, arrange the calculated red pixel data, green pixel data, and blue pixel data and the white pixel data to correspond to a pixel array structure, and supply the arranged data to the data driver circuit 50.

The control circuit 30 generates a data control signal on the basis of a timing synchronization signal and supplies the generated data control signal to the data driver circuit 50. The control circuit 30 generates a gate control signal on the basis of the timing synchronization signal and supplies the generated gate control signal to the gate driver circuit 70.

The data driver circuit 50 is connected to a plurality of data lines DL which are provided in the pixel array unit 10. The data driver circuit 50 receives the pixel data and the data control signal which are supplied from the control circuit 30 and receives a plurality of reference gamma voltages which are supplied from a power supply circuit. The data driver circuit 50 converts the pixel data into an analog pixel data signal using the data control signal and the plurality of reference gamma voltages and supplies the analog pixel data signal to the corresponding data lines DL.

The gate driver circuit 70 is connected to a plurality of gate lines GL which are provided in the pixel array unit 10. The gate driver circuit 70 generates a gate signal in a predetermined sequence on the basis of the gate control signal which is supplied from the control circuit 30 and supplies the generated gate signal to the corresponding gate lines GL.

The gate driver circuit 70 according to an embodiment may be integrated at one edge or both edges of the substrate through a process of manufacturing a thin-film transistor and be connected to the plurality of gate lines GL in a one-to-one correspondence manner. The gate driver circuit 70 according to another embodiment may be configured as an integrated circuit and mounted at the substrate or may be mounted at a flexible circuit film and connected to the plurality of gate lines GL in a one-to-one correspondence manner.

Figure 2:
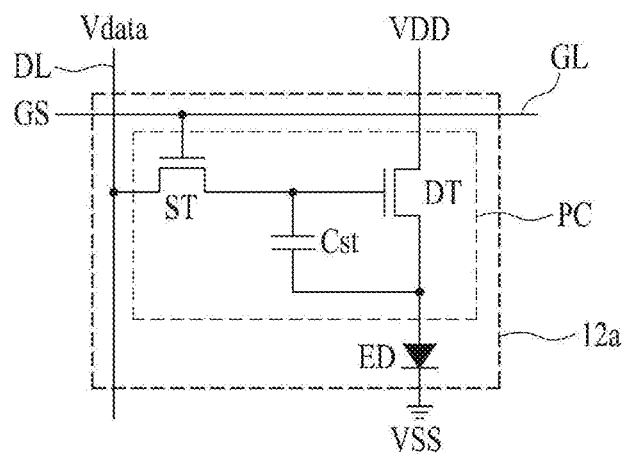
FIG. 2 is an equivalent circuit diagram illustrating a first pixel illustrated in FIG. 1.

FIG. 2 is an equivalent circuit diagram illustrating the first pixel illustrated in FIG. 1.

Referring to FIG. 2, the first pixel 12a of the light emitting display device according to this embodiment includes a pixel circuit PC and a light emitting element ED.

The pixel circuit PC is provided in a circuit area in a pixel area which is defined by the corresponding gate line GL and the corresponding data line DL and is connected to the corresponding gate line GL, the corresponding data line DL, and a first driving power supply VDD. The pixel circuit PC controls emission of light from the light emitting element ED in accordance with a data signal Vdata from the data line DL in response to a gate-on signal GS from the gate line GL.

The pixel circuit PC according to an embodiment may include a switching thin-film transistor ST, a driving thin-film transistor DT, and a capacitor Cst.

The switching thin-film transistor ST may include a gate electrode that is connected to the corresponding gate line GL, a first source/drain electrode that is connected to the corresponding data line DL, and a second source/drain electrode that is connected to the gate electrode of the driving thin-film transistor DT. The switching thin-film transistor ST is turned on in accordance with a gate-on signal GS supplied to the gate line GL and supplies the data signal Vdata supplied to the data line DL to the gate electrode of the driving thin-film transistor DT.

The driving thin-film transistor DT may include a gate electrode that is connected to the second source/drain electrode of the switching thin-film transistor ST, a drain electrode that is connected to the first driving power supply VDD, and a source electrode that is connected to the light emitting element ED. The driving thin-film transistor DT is turned on in accordance with a gate-source voltage based on the data signal Vdata supplied from the switching thin-film transistor ST and controls a current (or a data current) which is supplied from the first driving power supply VDD to the light emitting element ED.

The capacitor Cst is connected between the gate electrode and the source electrode of the driving thin-film transistor DT, stores a voltage corresponding to the data signal Vdata supplied to the gate electrode of the driving thin-film transistor DT, and turns on the driving thin-film transistor DT with the stored voltage. At this time, the capacitor Cst can maintain the turned-on state of the driving thin-film transistor DT until a new data signal Vdata is supplied via the switching thin-film transistor ST in a next frame.

The light emitting element ED is provided in an opening area in the pixel area and emits light in accordance with a current supplied from the pixel circuit PC.

The light emitting element ED according to an embodiment may include a first electrode that is connected to the source electrode of the driving thin-film transistor DT, a second electrode that is connected to a second driving power supply VSS, and a light emitting layer that is provided between the first electrode and the second electrode. For example, the light emitting layer may include one of an organic light emitting layer, an inorganic light emitting layer, and a quantum-dot light emitting layer or include a stacked or mixed structure of an organic light emitting layer (or an inorganic light emitting layer) and a quantum-dot light emitting layer.

The first pixel 12a of the light emitting display device according to this embodiment displays a predetermined image by causing the light emitting element ED to emit light in accordance with a current corresponding to the data signal Vdata. Similarly, the second to fourth pixels 12b, 12c, and 12d have substantially the same configuration as the first pixel 12a and thus description thereof will not be repeated.

In addition, the pixel circuit PC may include at least one sampling thin-film transistor that samples a characteristic value of the driving thin-film transistor DT and stores the sampled characteristic value in the capacitor Cst and may further include at least one initialization thin-film transistor that initializes the voltage of the capacitor Cst. The pixel circuit PC may further include a sensing thin-film transistor that transmits the characteristic value of the driving thin-film transistor DT and/or a characteristic value of the light emitting element ED to an external sensing circuit. As a result, a known pixel circuit of a light emitting display device may be applied as the pixel circuit PC according to the present disclosure.

Figure 3:
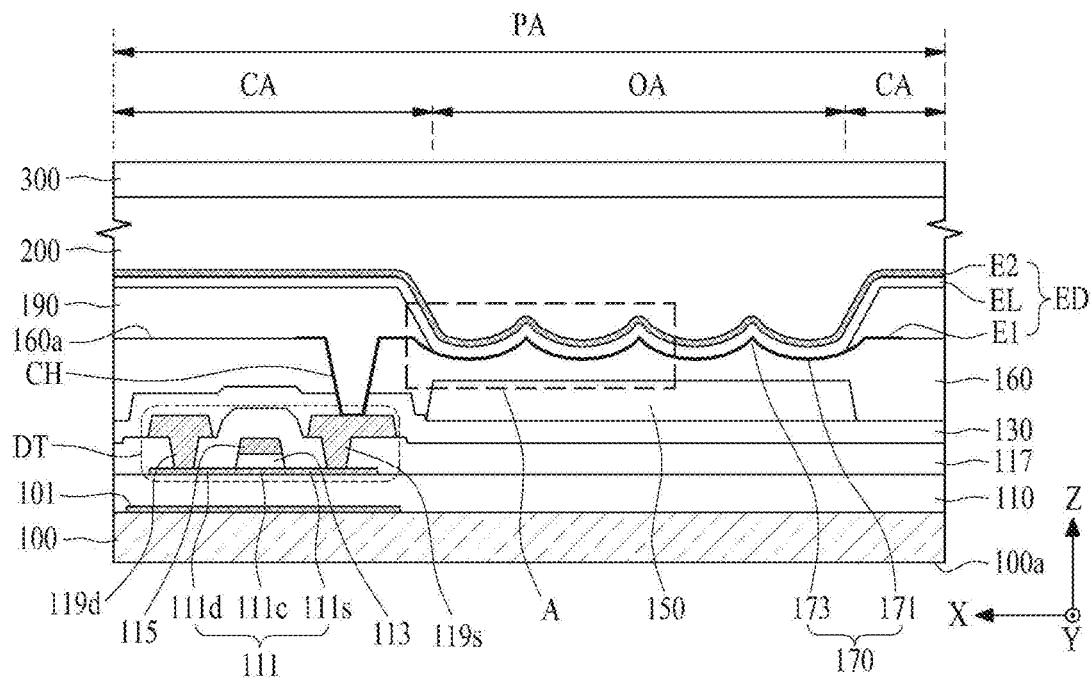
FIG. 3 is a sectional view illustrating a pixel according to an example embodiment of the present disclosure.
Figure 4:
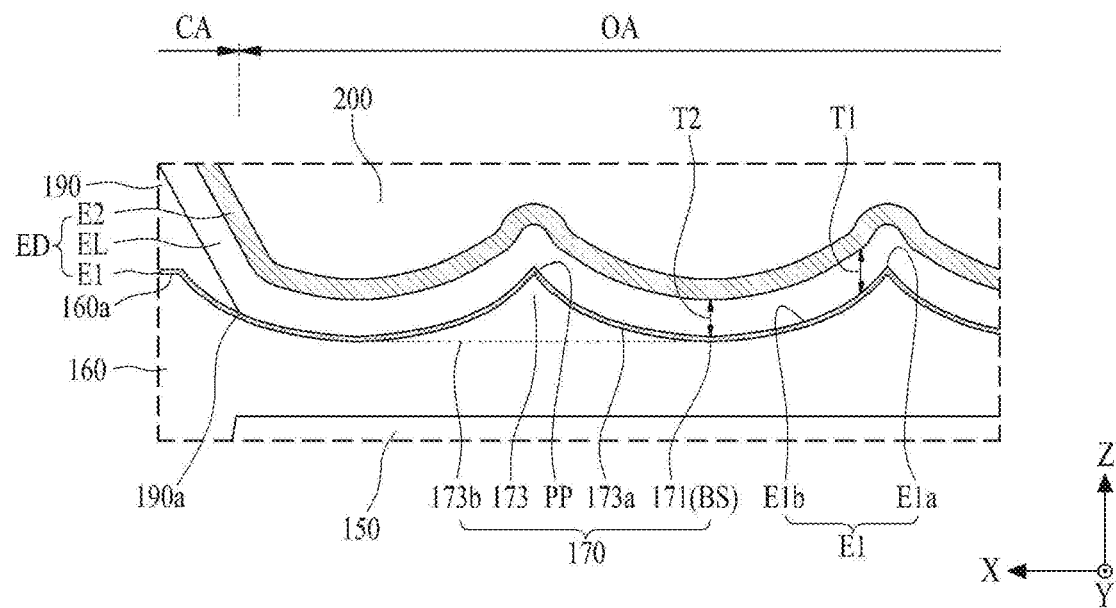
FIG. 4 is an enlarged view of part A illustrated in FIG. 3.
Figure 5:
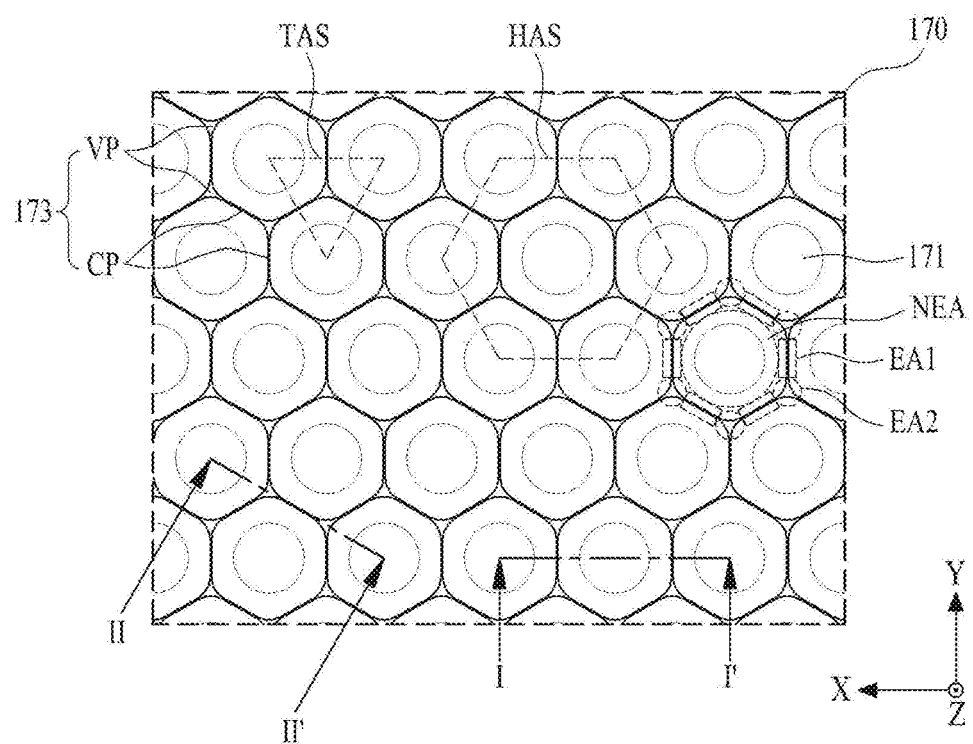
FIG. 5 is a plan view illustrating a planar structure of an uneven portion illustrated in FIG. 3.

FIG. 3 is a sectional view illustrating a pixel according to an embodiment of the present disclosure. FIG. 4 is an enlarged view of part A illustrated in FIG. 3. FIG. 5 is a plan view illustrating a planar structure of an uneven portion illustrated in FIG. 3.

Referring to FIGS. 3 to 5, a pixel according to an embodiment of the present disclosure includes a substrate 100 and a pixel area PA that is provided over the substrate 100.

The substrate 100 is mainly formed of a glass material, but may be formed of a transparent plastic material such as polyimide that may be bent or curved. When a plastic material is used as the material of the substrate 100, a high-temperature deposition process is performed over the substrate 100 and thus polyimide having excellent heat resistance that can stand at a high temperature may be used. The overall front surface of the substrate 100 may be overlaid with one or more buffer layers 110.

The buffer layer 110 serves to prevent materials included in the substrate 100 from diffusing into a transistor layer in a high-temperature process of the process of manufacturing a thin-film transistor. The buffer layer 110 can also serve to prevent external water or moisture from permeating the light emitting element. The buffer layer 110 may be formed of silicon oxide or silicon nitride. Selectively, the buffer layer 110 may be omitted in some cases.

The pixel area PA may include a circuit area CA and an opening area OA, wherein the opening area OA comprises an uneven portion 170 and a light emitting element ED.

The circuit area CA may include a transistor layer, a protection layer 130, and an overcoating layer 160.

The transistor layer may include a pixel circuit including a driving thin-film transistor DT.

The driving thin-film transistor DT according to an embodiment may include an active layer 111, a gate insulating film 113, a gate electrode 115, an interlayer insulating film 117, a drain electrode 119d, and a source electrode 119s.

The active layer 111 includes a channel region 111c, a drain region 111d, and a source region 111s that are formed in a driving thin-film transistor area of the circuit area CA defined over the substrate 100 or the buffer layer 110. The drain region 111d and the source region 111s may be separated to be parallel to each other with the channel region 111c interposed therebetween.

The active layer 111 according to an embodiment may be formed of a semiconductor material including one of amorphous silicon, polycrystalline silicon, an oxide, and an organic material, but is not limited thereto. For example, the active layer 111 according to the present disclosure may be formed of an oxide such as a Zinc Oxide, a Tin Oxide, a Ga—In—Zn Oxide, an In—Zn Oxide, or an In—Sn Oxide or may be formed of an oxide obtained by doping an oxide with ions of Al, Ni, Cu, Ta, Mo, Zr, V, Hf, or Ti.

The gate insulating film 113 according to an embodiment is formed over the channel region 111c of the active layer 111. The gate insulating film 113 may be formed in the form of islands over only the channel regions 111c of the active layer 111. The gate insulating film 113 according to an embodiment may be formed over the entire front surface of the substrate 100 or the buffer layer 110 including the active layer 111.

The gate electrode 115 is formed over the gate insulating film 113 to overlap the channel region 111c of the active layer 111. The gate electrode 115 may be formed of molybdenum Mo, aluminum Al, chromium Cr, gold Au, titanium Ti, nickel Ni, neodymium Nd, copper Cu, or an alloy thereof and may be formed as a single layer of the metal or alloy or multiple layers including two or more layers.

The interlayer insulating film 117 is formed over the gate electrode 115 and the drain region 111d and the source region 111s of the active layer 111. In this case, the interlayer insulating film 117 is formed over the entire front surface of the substrate 100 or the buffer layer 110 to cover (or to overlay) the gate electrode 115 and the drain region 111d and the source region 111s of the active layer 111. The interlayer insulating film 117 may be formed of an inorganic material such as a silicon oxide SiOx or a silicon nitride SiNx or may be formed of an organic material such as benzocyclobutene or photo acryl.

The drain electrode 119d is electrically connected to the drain region 111d of the active layer 111 via a first contact hole which is formed in the interlayer insulating film 117 overlapping the drain region 111d of the active layer 111.

The source electrode 119s is electrically connected to the source region 111s of the active layer 111 via a second contact hole which is formed in the interlayer insulating film 117 overlapping the source region 111s of the active layer 111.

The drain electrode 119d and the source electrode 111s are formed of the same metal material such as molybdenum Mo, aluminum Al, chromium Cr, gold Au, titanium Ti, nickel Ni, neodymium Nd, copper Cu, or an alloy thereof and may be formed as a single layer of the metal or alloy or multiple layers including two or more layers.

In addition, the circuit area CA further includes a switching thin-film transistor and a capacitor. The switching thin-film transistor is provided in the circuit area CA to have substantially the same structure as the driving thin-film transistor and thus description thereof will not be repeated. The capacitor is provided in an overlap area of the gate electrode 115 and the source electrode 119s of the driving thin-film transistor DT with the interlayer insulating film 117 interposed therebetween.

In addition, a transistor which is provided in the circuit area CA may have characteristics that a threshold voltage thereof is shifted by light. In order to prevent this phenomenon, the light emitting display device according to the present disclosure further includes a light blocking layer 101 that is provided below the active layer 111.

The light blocking layer 101 is provided between the substrate 100 and the active layer 111 and serves to minimize or prevent change in a threshold voltage of the transistor due to external light by blocking light which is incident at the active layer 111 via the substrate 100. The light blocking layer 101 is overlaid with the buffer layer 110. Selectively, the light blocking layer 101 may be electrically connected to the source electrode of the transistor to serve as a lower gate electrode of the corresponding transistor. In this case, the light blocking layer 101 minimizes or prevents change in characteristics due to light or change in a threshold voltage of the transistor due to a bias voltage.

The protection layer 130 is provided over the substrate 100 to cover (or to overlay) the transistor layer. In this case, the protection layer 130 covers the drain electrode 119d and the source electrode 119s of the driving thin-film transistor DT and the interlayer insulating film 117. For example, the protection layer 130 may be formed of an inorganic material such as silicon oxide SiOx or silicon nitride SiNx. Selectively, the protection layer 130 may be referred to as a passivation layer. The protection layer 130 may be omitted.

The overcoating layer 160 is provided over the substrate 100 to cover (or to overlay) the protection layer 130. The overcoating layer 160 is formed in a relatively large thickness and serves to provide a flat surface over the substrate 100. For example, the overcoating layer 160 may be formed of an organic material such as photo acryl, benzocyclobutene, polyimide, or a fluorine resin.

The opening area OA may be defined as an area other than the circuit area CA in the pixel area PA The uneven portion 170 is provided in the opening area OA to have an undulated (or uneven) shape and thus changes a propagation path of light emitted from the light emitting element ED to increase light extraction efficiency. Here, the uneven portion 170 may be referred to as a fine structure, an optical path control portion, a microlens portion, a microlens array or a non-planar portion.

The uneven portion 170 according to an embodiment may include a plurality of concave portions 171 that are separated from each other and protruding portions 173 that are provided between the plurality of concave portions 171.

Each of the plurality of concave portions 171 is provided to be concave from the front surface 160a of the overcoating layer 160 in the opening area OA. The concave portions 171 are separated from each other, are arranged in parallel in a first direction X, and are arranged in a zigzag in a second direction Y. In this case, the plurality of concave portions 171 are arranged in a lattic pattern with constant intervals and the concave portions 171 adjacent to each other in the second direction Y are arranged to cross each other. Accordingly, the centers of three neighboring concave portions 171 form a triangular shape TAS. Each of the plurality of concave portions 171 is surrounded with six concave portions 171 which are disposed in the surrounding thereof. Here, the centers of the six concave portions 171 surrounding one concave portion 171 two-dimensionally form a hexagonal shape HAS.

The plurality of concave portions 171 have the same depth from the front surface 160a of the overcoating layer 160, and some of the plurality of concave portions 171 may have different depths due to a fabrication error in a process of patterning the uneven portion 170.

The protruding portions 173 are provided between the neighboring concave portions 171 and surround the plurality of concave portions 171. The protruding portions 173 according to an embodiment are formed in a two-dimensionally hexagonal shape and surround the plurality of concave portions 171. Accordingly, the protruding portions 173 are formed two-dimensionally in a honeycomb structure. The protruding portions are provided in the overcoating layer 160 in the opening area OA to have a shape which can maximize external extraction efficiency of light which is emitted from the pixel over the basis of an effective emission area of the light emitting element ED. The plurality of protruding portions 173 change a propagation path of light emitted from the light emitting element ED toward the substrate 100 to enhance the external extraction efficiency of light emitted from the light emitting element ED.

The protruding portions 173 according to an embodiment may include a vertex portion VP that is provided between three neighboring concave portions 171 and a connection portion CP that is connected between two neighboring vertex portions VP between two neighboring concave portions 171 and that has a height less than that of the vertex portions VP.

One vertex portion VP is provided every three neighboring concave portions 171. The vertex portion VP has a sharp protruding portion in an area between (or among) three neighboring concave portions 171. For example, the vertex portion VP three-dimensionally has a triangular pyramid with concave side surfaces.

Since the one vertex portion VP is provided every three neighboring concave portions 171, the uneven portion 170 includes a plurality of vertex portions VP. The plurality of vertex portions VP are arranged in the uneven portion 170 to have a hexagonal shape (or a honeycomb structure). In this case, six neighboring vertex portions VP forming a hexagonal shape are arranged around one concave portion 171 at the same intervals. Accordingly, the six vertex portions VP arranged around one concave portion 171 may be considered to be arranged at vertices of a hexagonal shape centered over the center of the concave portion 171. The vertex portions VP are defined as areas having the largest height in the area of a protruding portion 173 with respect to the bottom surface BS of the concave portions 171 (or the protruding portions 173).

The connection portion CP is provided between two neighboring concave portions 171 and both ends thereof are connected to two neighboring vertex portions VP. The connection portion CP according to an embodiment may be stepped from the vertex portions VP. In this case, the connection portion CP is formed to have a height less than that of the vertex portions VP with respect to the bottom surface BS of the concave portions 171 (or the protruding portions 173).

Six vertex portions VP and six connection portions CP which are arranged around one concave portion 171 are connected to each other to form a hexagonal shape. Accordingly, when six vertex portions VP and six connection portions CP which are connected to surround one concave portion 171 are defined as one protruding pattern, the vertex portion VP may be defined as a portion in which three protruding patterns surrounding three neighboring concave portions 171 which are arranged to form a triangular shape meet each other. Accordingly, the vertex portion VP may be referred to as a multi-point or a triple point.

The connection portion CP according to an embodiment may have a sectional shape including a sharp peak portion PP. For example, the connection portion CP includes a first curved portion 173a which is provided to be concave between the bottom surface BS of the protruding portions 173 and the peak portion PP and may have a triangular section with the first curved portion 173a as a hypotenuse. In this case, the total height of the peak portion PP may be less than the total height of the vertex portion VP. The peak portion PP has a sharp tip and thus may be referred to as a first apex portion.

An interval (or a pitch) between the peak portions PP of the connection portion CP according to an embodiment may be equal to or less than the diameter of the bottom surface BS of the protruding portion 173. In this case, when the interval between the peak portions PP of the connection portion CP is greater than the diameter of the bottom surface BS of the protruding portion 173, the density of the concave portions 171 (or the protruding portions 173) which are provided in the opening area OA of the pixel area PA decreases and thus external extraction efficiency of light emitted from the light emitting element ED can decrease because the peak portion PP of the connection portion CP has an unsharp curved (or protruding) shape.

The uneven portion 170 according to an embodiment may be formed by forming a mask pattern over the opening area OA of the overcoating layer 160 through a photolithography using photoresist and then etching process the overcoating layer 160 using the mask pattern.

The light emitting element ED is provided over the uneven portion 170 of the opening area OA and emits light to the substrate 100 in accordance with a bottom emission system. The light emitting element ED according to an embodiment may include a first electrode E1, a light emitting layer EL, and a second electrode E2.

The first electrode E1 is formed over the overcoating layer 160 in the pixel area PA and is electrically connected to the source electrode 119s of the driving thin-film transistor DT. In this case, one end of the first electrode E1 adjacent to the circuit area CA extends over the source electrode 119s of the driving thin-film transistor DT and is electrically connected to the source electrode 119s of the driving thin-film transistor DT via a contact hole CH provided in the overcoating layer 160 and the protection layer 130.

The first electrode E1 comes into direct contact with the uneven portion 170 and thus has a shape (or a surface shape) which conforms to the shape of the uneven portion 170. In this case, since the first electrode E1 is formed (or deposited) in a relatively small thickness over the overcoating layer 160, the first electrode E1 has a contour (or a second contour) which conforms to the contour (morphology) (or a first contour) of the uneven portion 170. Accordingly, since the first electrode E1 is formed in a conformal shape which conforms to the contour (or morphology) of the uneven portion 170 through a process of depositing a transparent conductive material, the first electrode E1 has the same sectional structure as the uneven portion 170.

The first electrode E1 serves as an anode electrode of the light emitting element ED. The first electrode E1 according to an embodiment may include a transparent conductive material such as transparent conductive oxide (TCO) such that light emitted from the light emitting layer EL is transmitted to the substrate 100. For example, the first electrode E1 may be formed of indium tin oxide (ITO) or indium zinc oxide (IZO).

The light emitting layer EL is formed over the first electrode E1 and comes into direct contact with the first electrode E1. In this case, the light emitting layer EL is formed (or deposited) in a larger thickness than the first electrode E1 and thus has a contour (a third contour) which does not conform to the contours of the plurality of concave portions 171 or the contours of the first electrode E1. For example, the light emitting layer EL has a shape which conforms to the contour of the first curved portions 173a of the protruding portions 173 or the first electrode E1, and the peak portion of the light emitting layer EL overlapping the vertex portion VP and the peak portion PP of each protruding portions 173 has an unsharp convex-curved shape. Accordingly, the light emitting layer EL is formed in a non-conformal shape which does not conform the contour (or morphology) of the first electrode E1 through a deposition process and thus has a sectional structure which is different from that of the first electrode E1 (or the uneven portion). The peak portion of the light emitting layer EL having a convex curved shape increases external extraction efficiency of light which is emitted from the light emitting layer EL by changing a propagation path of light which is incident thereon to extract light which is not externally extracted due to repeated total reflection in the light emitting layer EL.

The light emitting layer EL according to an embodiment is formed to have a thickness which increases toward the bottom surface BS of the protruding portions 173 or the concave portion 171. For example, the light emitting layer EL which is formed over the connection portion CP of the protruding portions 173 has a first thickness T1 in an upper portion of the connection portion CP and has a second thickness T2 which is larger than the first thickness T1 in the bottom surface BS of the concave portion 171. Similarly, the light emitting layer EL which is formed over the vertex portion VP of the protruding portions 173 has a thickness which is the smallest in the vertex portion VP and increases gradually from the vertex portion VP to an intermediate portion of the connection portion CP.

The light emitting layer EL according to an embodiment may include two or more light emitting portions for emitting white light. For example, the light emitting layer EL includes a first light emitting portion and a second light emitting portion for emitting white light by mixing first light and second light. Here, the first light emitting portion emits first light and includes one of a blue light emitting portion, a green light emitting portion, a red light emitting portion, a yellow light emitting portion, and a yellowish green light emitting portion. The second light emitting portion includes a light emitting portion that emits light having a complementary color relationship with the first light out of the blue light emitting portion, the green light emitting portion, the red light emitting portion, the yellow light emitting portion, and the yellowish green light emitting portion.

The light emitting layer EL according to another embodiment may include one of a blue light emitting portion, a green light emitting portion, and a red light emitting portion. For example, when a pixel is a red pixel, a light emitting layer of the red pixel includes a red light emitting portion. When a pixel is a green pixel, a light emitting layer of the green pixel includes a green light emitting portion. When a pixel is a blue pixel, a light emitting layer of the blue pixel includes a blue light emitting portion.

The second electrode E2 is formed over the light emitting layer EL and comes into direct contact with the light emitting layer EL. In this case, the second electrode E2 is formed (or deposited) over the light emitting layer EL to have a smaller thickness than the light emitting layer EL. Here, the second electrode E2 is formed (or deposited) in a relatively small thickness over the light emitting layer EL and thus has a contour which conforms to the contour of the light emitting layer EL. Accordingly, the second electrode E2 has the same sectional structure as the light emitting layer EL.

The second electrode E2 according to an embodiment may serve as a cathode electrode of the light emitting element ED. For example, the second electrode E2 may include a metal material having high reflectance to reflect light, which is emitted from the light emitting layer EL and is incident thereon, to the substrate 100. For example, the second electrode E2 may be formed in a multi-layer structure such as a stacked structure (Ti/Al/Ti) of aluminum Al and titanium Ti, a stacked structure (ITO/Al/ITO) of aluminum Al and ITO, an APC (Ag/Pd/Cu) alloy, and a stacked structure (ITO/APC/ITO) of an APC (Ag/Pd/Cu) alloy and ITO, or may have a single-layer structure including one material or two or more alloy materials selected from silver Ag, aluminum Al, molybdenum Mo, gold Au, magnesium Mg, calcium Ca, and barium Ba.

The light emitting element ED includes non-effective emission areas NEA and first and second effective emission areas EA1 and EA2 depending on the thickness of the light emitting layer EL. Accordingly, the opening area OA of a pixel according to the present disclosure includes a plurality of non-effective emission areas NEA and the first and second effective emission areas EA1 and EA2.

Each non-effective emission area NEA is provided in an area overlapping the bottom surface BS of each of the plurality of concave portions 171. For example, each non-effective emission area NEA may include an area overlapping the bottom surface BS of each of the plurality of concave portions 171 and a lower portion of the protruding portion 173 in which the light emitting layer EL is formed in a relatively large thickness. In this case, the lower portion of the protruding portion 173 may include a lower portion of the vertex portion VP and a lower portion of the connection portion CP.

Each first effective emission area EA1 may be provided between two neighboring concave portions 171. For example, the first effective emission area EA1 may include an area overlapping a middle area and an upper area of the connection portion CP which is provided between two neighboring vertex portions VP in which the light emitting layer EL is formed in a relatively small thickness.

Each second effective emission area EA2 is provided between three neighboring concave portions 171. For example, each second effective emission area EA2 may include an area overlapping a middle area and an upper area of the vertex portion VP which is provided between three neighboring concave portions 171 in which the light emitting layer EL is formed in a relatively more small thickness. Each second effective emission area EA2 may have higher luminance than the first effective emission areas EA1.

The opening area OA according to the present disclosure may further include a wavelength conversion layer 150.

The wavelength conversion layer 150 may be provided between the substrate 100 and the uneven portion 170 to overlap the opening area OA.

The wavelength conversion layer 150 according to an embodiment is provided over the protection layer 130 to overlap the opening area OA. In this case, the wavelength conversion layer 150 is supported by the protection layer 130 and is overlaid (or overlaid) with the overcoating layer 160, whereby the wavelength conversion layer 150 may be provided between the protection layer 130 and the uneven portion 170 to overlap the opening area OA.

The wavelength conversion layer 150 according to another embodiment may be provided between the interlayer insulating film 117 and the protection layer 130 or between the substrate 100 and the interlayer insulating film 117 to overlap the opening area OA.

The wavelength conversion layer 150 according to a first embodiment includes a color filter that transmits only wavelengths of a color which is set for the pixel out of light emitted from the light emitting element ED to the substrate 100. For example, the wavelength conversion layer 150 may transmit only light with wavelengths of red, green, or blue. In the light emitting display device according to the present disclosure, when one unit pixel includes first to third pixels adjacent to each other, the wavelength conversion layer provided in the first pixel may include a red color filter, the wavelength conversion layer provided in the second pixel may include a green color filter, and the wavelength conversion layer provided in the third pixel may include a blue color filter. In addition, in the light emitting display device according to the present disclosure, one unit pixel may further include a white pixel in which a wavelength conversion layer is not formed.

The wavelength conversion layer 150 according to a second embodiment may include quantum dots having a size capable of re-emitting light according to light emitted from the light emitting element ED to the substrate 100 and discharging light of a color which is set for the pixel. In this case, the quantum dots may be selected from CdS, CdSe, CdTe, CdZnSeS, ZnS, ZnSe, GaAs, GaP, GaAs—P, Ga—Sb, InAs, InP, InSb, AlAs, AlP, and AlSb. For example, the wavelength conversion layer of the first pixel may include quantum dots of CdSe or InP, the wavelength conversion layer of the second pixel may include quantum dots of CdZnSeS, and the wavelength conversion layer of the third pixel may include quantum dots of ZnSe. In this way, the light emitting display device in which the wavelength conversion layer 150 includes quantum dots can realize high color reproducibility.

The wavelength conversion layer 150 according to a third embodiment may include a color filter including quantum dots.

The light emitting display device according to the present disclosure may further include a bank layer 190 and an encapsulation layer 200.

The bank layer 190 serves to define the opening area OA in the pixel area PA and is provided over an edge of the first electrode E1 and the overcoating layer 160. The bank layer 190 may be formed of an organic material such as a benzocyclobutene (BCB)-based resin, an acryl-based resin, or a polyimide resin. Alternatively, the bank layer 190 may be formed of a photosensitive material including a black pigment. In this case, the bank layer 190 also serves as a light blocking member between neighboring pixels.

The bank layer 190 according to an embodiment is formed over a flat surface 160a of the overcoating layer 160 to cover (or to overlay) the edge of the first electrode E1 extending over the circuit area CA of the pixel area PA.

The bank layer 190 according to another embodiment may be provided to cover (or to overlay) the edge of the uneven portion 170. In this case, the light emitting layer EL is formed over the first electrode E1, the bank layer 190, and a stepped portion between the first electrode E1 and the bank layer 190. When the light emitting layer EL is formed in a small thickness over the stepped portion between the first electrode E1 and the bank layer 190, electrical contact (short-circuit) between the second electrode E2 and the first electrode E1 may occur. In order to prevent this problem, the opening area OA which is defined by the bank layer 190 is formed to have a two-dimensional size which is smaller than that of the uneven portion 170 of the overcoating layer 160. An end 190a of the bank layer 190 according to an embodiment may be disposed at an edge of the uneven portion 170 to decrease a height difference between the first electrode E1 and the bank layer 190. In this case, the end 190a of the bank layer 190 that defines a boundary between the circuit area CA and the opening area OA of the pixel area PA may be disposed over the first electrode E1 overlapping the first curved portion 173a of the outermost protruding portion 173 out of the protruding portions 173. For example, the end 190a of the bank layer 190 is located over the first curved portion 173a of the outermost protruding portion 173 disposed between the flat surface 160a of the overcoating layer 160 and the outermost concave portion 171.

In some embodiments, the bank layer 190 may at least partially overlay one or more of the concave portions 171 disposed at the edge of the uneven portion 170. For example, the bank layer 190 may overlay about one and half the concave portion 171. In some embodiments, the end 190a of the bank layer 190 is located between a flat surface 160a of the overcoating layer 160 and the bottom portion of the first curved portion 173a.

Additionally, the wavelength conversion layer 150 according to one embodiment may extend to overlap the bank layer 190. For example, the ends of the wavelength conversion layer 150 may be located in the circuit area CA and may underlie portions of the bank layer 190.

The light emitting layer EL and the second electrode E2 of the light emitting element ED are also formed over the bank layer 190. In this case, the light emitting layer EL is formed over the substrate 100 in which the first electrode E1 and the bank layer 190 are provided, and the second electrode E2 is formed to cover (or to overlay) the light emitting layer EL.

The encapsulation layer 200 is formed over the substrate 100 to cover (or to overlay) the second electrode E2, that is, the entire pixel array unit 10. The encapsulation layer 200 serves to protect the thin-film transistors, the light emitting elements ED, and the like from an external impact and to prevent oxygen and/or moisture and particles from permeating the light emitting element ED.

The encapsulation layer 200 according to an embodiment may include at least one inorganic film. The encapsulation layer 200 may further include at least one organic film. For example, the encapsulation layer 200 may include a first inorganic encapsulation layer, an organic encapsulation layer, and a second inorganic encapsulation layer. The first and second inorganic encapsulation layers include one inorganic material out of a silicon oxide film SiOx, a silicon nitride film SiNx, a silicon oxynitride film SiON, a titanium oxide film TiOx, and an aluminum oxide film AlOx. The organic encapsulation layer is formed of one organic material from an acryl resin, an epoxy resin, a phenolic resin, a polyamide resin, a polyimide resin, and a benzocyclobutene resin. The organic encapsulation layer may be referred to as a particle overlay layer.

Selectively, the encapsulation layer 200 may be replaced with a filler surrounding the overall pixel array unit 10. In this case, the light emitting display device according to the present disclosure further includes an encapsulation substrate 300 that is attached to the substrate 100 with the filler interposed therebetween. The encapsulation substrate 300 may be formed of a metal material.

Additionally, the light emitting display device according to the present disclosure may further include a polarization film that is attached to a rear surface (or a light extraction surface) 100a of the substrate 100. The polarization film changes external light which is reflected by the thin-film transistors and/or the lines which are provided in the pixel into a circularly polarized state to improve visibility and a contrast ratio of the light emitting display device.

In the light emitting display device according to the embodiment of the present disclosure, a path of light emitted from the light emitting element ED is changed by the uneven portion 170 provided in the opening area OA of the pixel to improve the light extraction efficiency, whereby it is possible to enhance luminance and to reduce power consumption. Since the light emitting display device according to the embodiment of the present disclosure includes the light emitting layer EL having a contour different from the contour of the uneven portion 170 provided in the opening area OA of the pixel, it is possible to further improve the external extraction efficiency of light by reflecting light, which is not externally extracted due to repeated total reflection in the light emitting layer EL, using the peak portions of the light emitting element ED having an unsharp convex curved shape over the vertex portions VP and the peak portions PP of the protruding portions 173 and externally extracting the light. In this case, in the light emitting display device according to the embodiment of the present disclosure, it is possible to further improve external extraction efficiency of light by extraction of light in the connection portion CP provided between two neighboring concave portions 171 provided in the uneven portion 170 and extraction of light in the vertex portion VP between three neighboring concave portions 171 provided in the uneven portion 170.

Figure 6:
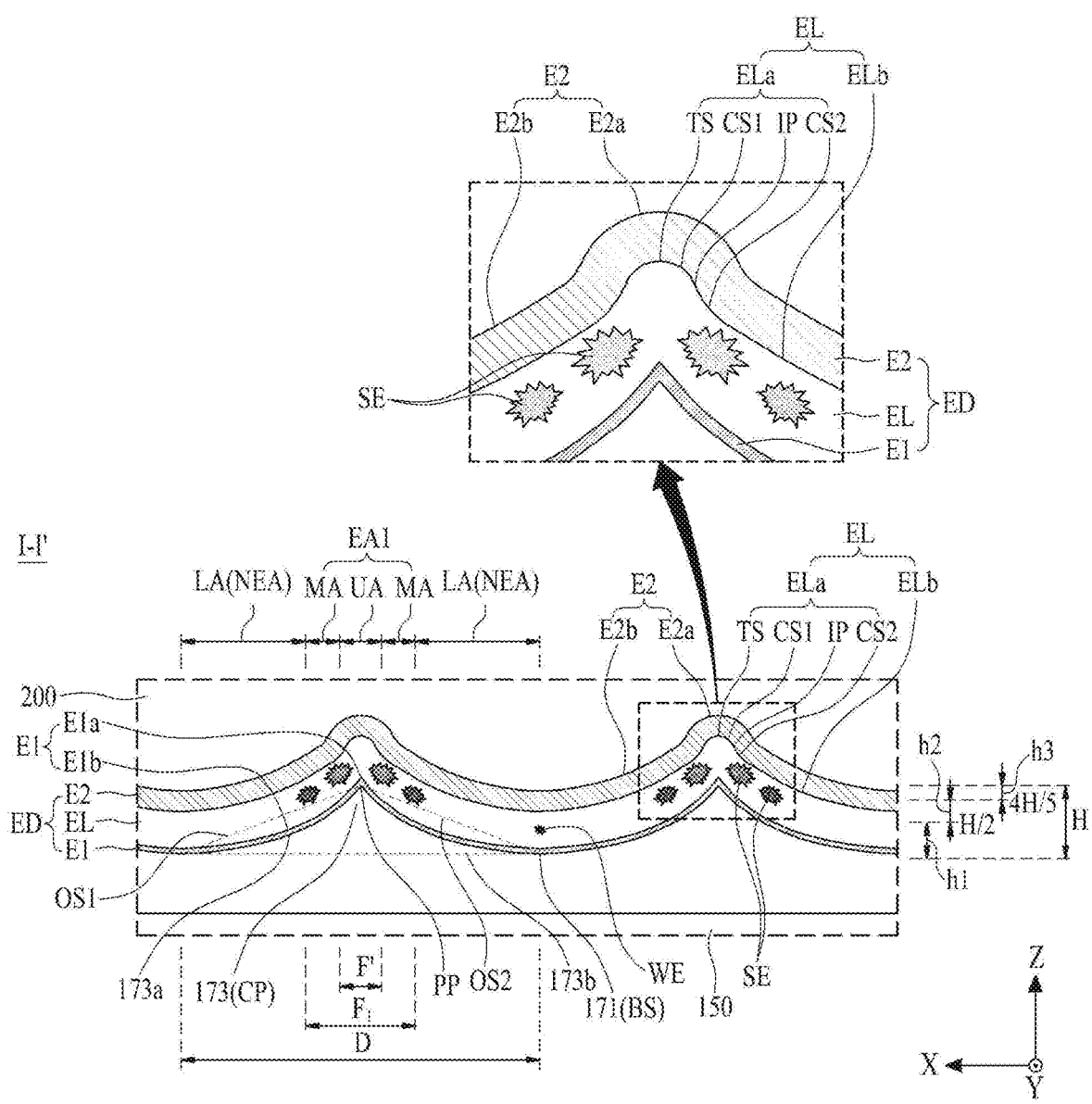
FIG. 6 is a sectional view taken along line I-I' in FIG. 5.
Figure 7:
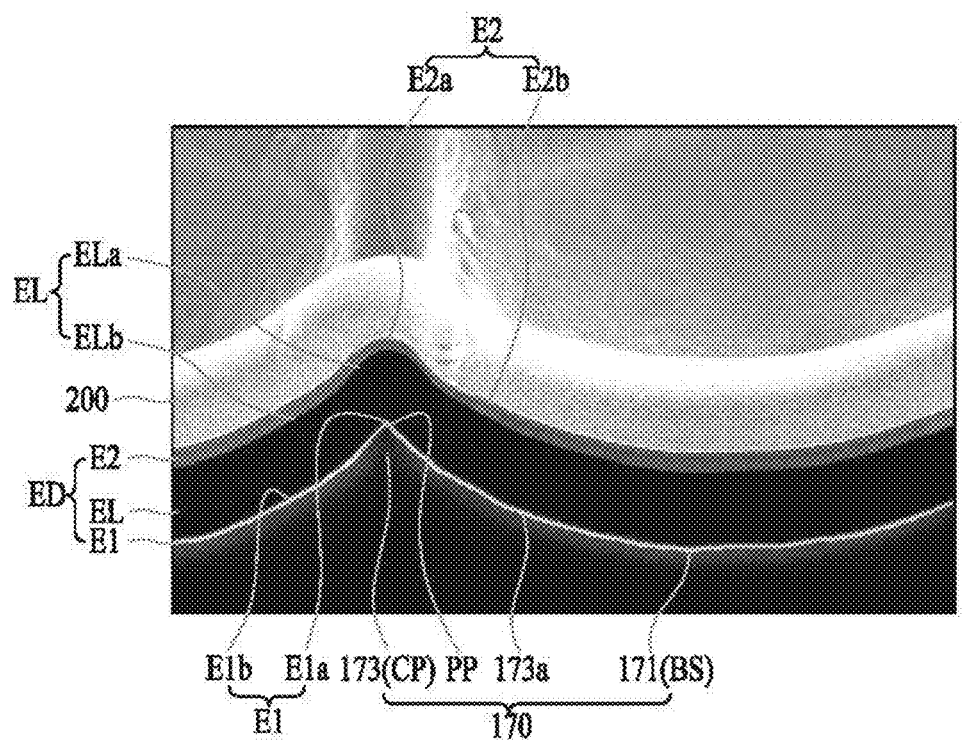
FIG. 7 is an enlarged view of a microscope image of a connection portion in a protruding portion illustrated in FIG. 6.
Figure 8:
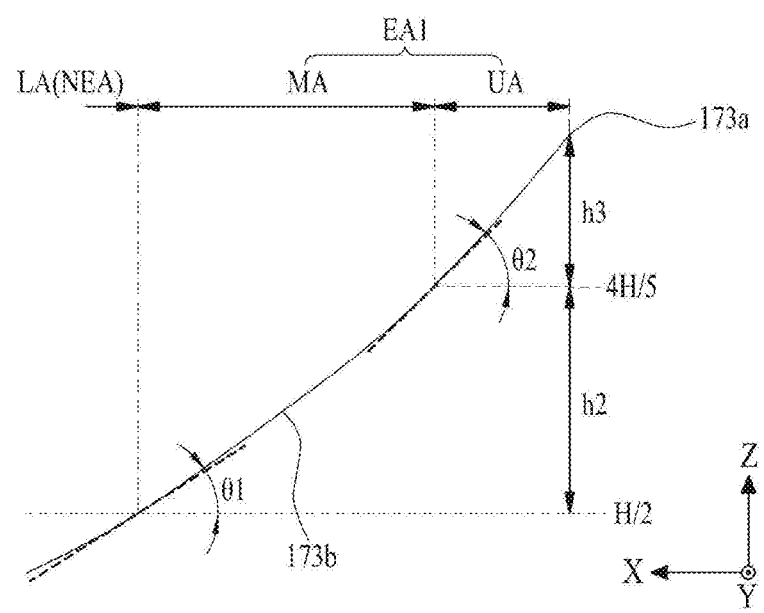
FIG. 8 is a diagram illustrating a first curved portion of a connection portion in a protruding portion illustrated in FIG. 6.

FIG. 6 is a sectional view taken along line I-I' in FIG. 5. FIG. 7 is an enlarged view of a microscope image of a section of a connection portion in a protruding portion illustrated in FIG. 6. FIG. 8 is a diagram illustrating a first curved portion of the connection portion in the protruding portion illustrated in FIG. 6. These are diagrams illustrating sectional structures of the connection portion of the protruding portion provided in the uneven portion and the light emitting element according to the present disclosure.

Referring to FIGS. 6 to 8, the connection portion CP of the protruding portion provided in the uneven portion 170 according to an embodiment of the present disclosure includes a sharp peak portion PP (or a first sharp portion) and thus extracts light, which is not externally extracted due to repeated total reflection in the light emitting layer EL, to the outside. In this case, external extraction efficiency of light is determined depending on the shapes of the connection portion CP of the protruding portion 173 and the light emitting element ED.

The connection portion CP of the protruding portion 173 includes a lower area LA, a middle area MA, and an upper area UA with respect to a height H thereof.

The lower area LA of the connection portion CP is defined as an area corresponding to a height h1 between the bottom surface BS of the protruding portion 173 and a half-height (H/2) position with respect to the total height H between the bottom surface BS and the peak portion PP of the protruding portion 173.

The middle area MA of the connection portion CP is provided between the lower area LA and the upper area and is defined as an area corresponding to a height h2 between the half-height (H/2) position and a 4/5-height (4H/5) position with respect to the total height H between the bottom surface BS and the peak portion PP of the protruding portion 173.

The upper area UA of the connection portion CP is provided between the middle area MA and the peak portion PP and is defined as an area corresponding to a height h3 between the 4/5-height (4H/5) position and the peak portion PP with respect to the total height H between the bottom surface BS and the peak portion PP of the protruding portion 173.

The connection portion CP includes an upper side region and a lower side region with respect to the half-height (H/2) position. In this case, the lower side region of the connection portion CP includes the lower area LA. The upper side region of each of the plurality of protruding portions 173 includes the middle area MA and the upper area UA.

The connection portion CP includes a peak portion PP, a bottom surface 173b of the protruding portion 173 located in the same line as the bottom surface BS of the concave portion 171, and a first curved portion 173a which is provided to be concave between the peak portion PP and the bottom surface BS. The connection portion CP has a triangular sectional structure including a vertex corresponding to the peak portion PP, a bottom side corresponding to the bottom surface 173b of the protruding portion 173, and hypotenuses OS1 and OS2 corresponding to the first curved portions 173a.

The peak portion PP of the connection portion CP is formed in a sharp structure to enhance light extraction efficiency of the pixel. The first curved portions 173a of the connection portion CP is formed in a concave curved shape between the peak portion PP and the bottom surface 173b of the protruding portion 173.

The first curved portions 173a of the connection portion CP has a tangent slope which decreases gradually from the peak portion PP to the bottom surface BS of the concave portion 171. In this case, the tangent slope is defined as a tangential value of an angle between an extension line extending from the bottom surface 173b of the protruding portion 173 and the first curved portions 173a.

The first curved portions 173a according to an embodiment may have a largest tangent slope, that is, a maximum tangent slope, in the middle area MA and the upper area UA of the connection portion CP, and may preferably have a maximum tangent slope at 4/5-height (4H/5) position which is the boundary between the middle area MA and the upper area UA of the connection portion CP. For example, the first curved portions 173a may have a first tangent slope tan θ1 at the half-height (H/2) position of the connection portion CP and a second tangent slope tan θ2 at the 4/5-height (4H/5) position of the connection portion CP. In this case, the second tangent slope tan θ2 is larger than the first tangent slope tan θ1 such that light emitted from the first effective emission area EA1 of the connection portion CP is not trapped in the light emitting element ED but is extracted to the outside as much as possible. When the second tangent slope tan θ2 is smaller than the first tangent slope tan θ1, the upper area UA of the connection portion CP has a slow slope and thus light emitted from the first effective emission area EA1 is not extracted to the outside due to total reflection but is trapped in the light emitting element ED, whereby the light extraction efficiency decreases.

The light emitting element ED over the connection portion CP according to the present disclosure emits a maximum amount of light from an area with the maximum tangent slope in the first curved portions 173a of the connection portion CP. When the maximum tangent slope of the first curved portions 173a is located in the middle area MA and the upper area UA of the connection portion CP which are the first effective emission area EA1, light emitted from the light emitting element ED propagates at an angle less than a total reflection threshold value, and the maximum light extraction efficiency may be achieved as the external emission efficiency increases due to multiple reflection. For this end, in an example of the present disclosure, by locating the maximum tangent slope of the first curved portions 173a at the 4/5-height (4H/5) position which is the boundary between the middle area MA and the upper area UA of the connection portion CP, it is possible to enhance the external extraction efficiency of light emitted from the first effective emission area EA1 of the connection portion CP. In another example of the present disclosure, by gradually increasing the maximum tangent slope of the first curved portions 173a from the 4/5-height (4H/5) position to the peak portion PP of the connection portion, it is possible to maximize the external extraction efficiency of light emitted from the first effective emission area EA1 of the connection portion CP.

The first electrode E1 over the connection portion CP according to the present disclosure is formed to be in contact with the surfaces of the connection portion CP and has a relatively small thickness, and thus has a contour which conforms to the contour of connection portion CP. For example, the first electrode E1 over the connection portion CP is formed to cover (or to overlay) the connection portion CP in a conformal manner through a process of depositing a transparent conductive material. For example, the first electrode E1 over the connection portion CP may include a second sharp portion E1a having a sharp shape which is formed over the peak portion PP and a second curved portion E1b having a concave curved shaped which is formed over the first curved portions 173a of the connection portion CP. Here, the second curved portion E1b has a symmetric structure with respect to the second sharp portion E1a.

The light emitting layer EL of the light emitting element ED provided over the connection portion CP according to the present disclosure is formed to have a thickness increasing gradually from the upper area UA to the lower area LA depending on the shape of the connection portion CP. For example, when the light emitting layer EL is deposited using a deposition method, a deposition material for the light emitting layer EL has straightness in the vertical direction Z and thus the light emitting layer EL has different thicknesses in the upper area UA, the middle area MA, and the lower area LA of the connection portion CP depending on the tangent slope of the connection portion CP. In this case, the light emitting layer EL over the connection portion CP has the smallest thickness in the upper area UA of the connection portion CP in which the tangent slope is relatively large and has the largest thickness in the lower area LA of the connection portion CP in which the tangent slope is relatively small (or relatively slow).

When the light emitting layer EL includes an organic light emitting layer, emission of light from the light emitting element ED occurs mainly in an area having a high current density. In the light emitting element ED over the connection portion CP according to the present disclosure, relatively strong emission of light SE occurs due to a relatively high current density in the upper area UA and the middle area MA of the connection portion CP having a relatively small thickness, and relatively weak (or slight) emission of light WE occurs due to a relatively low current density in the lower area LA of the connection portion CP having a relatively large thickness. Accordingly, the upper area UA and the middle area MA of the connection portion CP are defined as a first effective emission area EA1 (or a first partial emission area) in the opening area OA, and the lower area LA of the connection portion CP is defined as a non-effective emission area NEA (or a non-emission area) in the opening area OA.

The light emitting layer EL over the connection portion CP according to the present disclosure is formed to be non-conformal with respect to the first electrode E1 or the connection portion CP of the protruding portion 173. According to an embodiment, the light emitting layer EL on the connection portion CP may include a first uplifted portion ELa which overlaps the peak portion PP of the connection portion CP (or the second sharp portion of the first electrode E1) and a third curved portion ELb which overlaps the first curved portions 173a of the connection portion CP.

The third curved portion ELb is formed over the second curved portion E1b of the first electrode E1 and has a symmetric structure with respect to the first uplifted portion ELa. The light emitting layer EL including the third curved portion ELb is formed to have a thickness which increases gradually toward the concave portion 171 of the uneven portion 170. In this case, the third curved portion ELb of the light emitting layer EL has a first thickness in the upper side region MA and UA including the peak portion PP of the connection portion CP and has a second thickness larger than the first thickness in the bottom surface BS of the concave portion 171. Accordingly, the light emitting layer EL over the connection portion CP strongly emits light in the upper side region MA and UA of the connection portion CP having a high current density due to the relatively small first thickness and thus it is possible to enhance light extraction efficiency. On the other hand, the light emitting layer EL over the connection portion CP weakly emits light in the lower side region LA of the connection portion CP having a low current density due to the relatively large second thickness and thus it is possible to reduce power consumption.

The first uplifted portion ELa is formed convex to have a non-conformal shape with respect to the peak portion PP with a sharp structure of the connection portion CP. In this case, the first uplifted portion ELa protrudes from the third curved portion ELb overlapping the peak portion PP of the connection portion CP to cover (or to overlay) the peak portion PP of the connection portion CP. The first uplifted portion ELa may be referred to as a convex protruding portion.

The first uplifted portion ELa is formed to have a curvature for preventing light, which is totally reflected and incident in the light emitting layer EL due to emission of light from the light emitting layer EL, from being totally reflected into the light emitting layer EL again. For example, the first uplifted portion ELa may have a dome or bell structure having a convex sectional shape. The first uplifted portion ELa reflects light, which is totally reflected in the light emitting layer EL and incident due to emission of light from the light emitting layer EL, toward the substrate 100 to increase the external extraction efficiency of light which is emitted from the light emitting layer EL. For example, the first uplifted portion ELa serves as a concave lens that reflects light which is emitted from the first effective emission area EA1 of the light emitting element ED and is incident thereon toward the substrate 100.

The first uplifted portion ELa according to an embodiment may have a dome structure having an inflection portion IP. In this case, the first uplifted portion ELa may include a tip surface TS (or a top surface TS), an inflection portion IP, a convex surface CS1, and a concave surface CS2. The first uplifted portion ELa has a symmetric structure with respect to the tip surface TS.

The tip surface TS overlaps the peak portion PP of the connection portion CP. For example, the tip surface TS overlaps the second sharp portion E1a of the first electrode E1 having a sharp shape.

The inflection portion IP is located between the tip surface TS and the third curved portion ELb. For example, the inflection portion IP may be located over the first curved portions 173a between the peak portion PP and the 4/5-height (4H/5) position of the connection portion CP to reflect light, which is totally reflected from the peak portion PP of the connection portion CP, toward the substrate, whereby it is possible to enhance external extraction efficiency of light. The inflection portion IP is also referred to as an inflection point.

The convex surface CS1 is formed to be convex from the tip surface TS. In this case, the convex surface CS1 is formed to be convex between the tip surface TS and the inflection portion IP. The concave surface CS2 is formed to be concave from the convex surface CS1. For example, the concave surface CS2 is formed to be concave between the inflection portion IP and the third curved portion ELb. The convex surface CS1 and the concave surface CS2 change a path of light which is incident at the first uplifted portion ELa from the light emitting element ED toward the substrate to prevent total reflection of incident light, whereby it is possible to enhance light extraction efficiency of a pixel.

Since the second electrode E2 of the light emitting element ED provided over the connection portion CP according to the present disclosure is formed to be in contact with the surface of the light emitting layer EL and has a thickness smaller than that of the light emitting layer EL, the second electrode E2 has a contour which conforms to the contour of the light emitting layer EL. For example, the second electrode E2 over the connection portion CP may include a first dome portion E2a that overlaps the first uplifted portion ELa of the light emitting layer EL and a fourth curved portion E2b that is formed over the third curved portion ELb of the light emitting layer EL. The second electrode E2 of the connection portion CP reflects a path of light which is incident thereon from the light emitting element ED over the connection portion CP toward the substrate to prevent total reflection of incident light, whereby it is possible to improve light extraction efficiency of a pixel.

Figure 9:
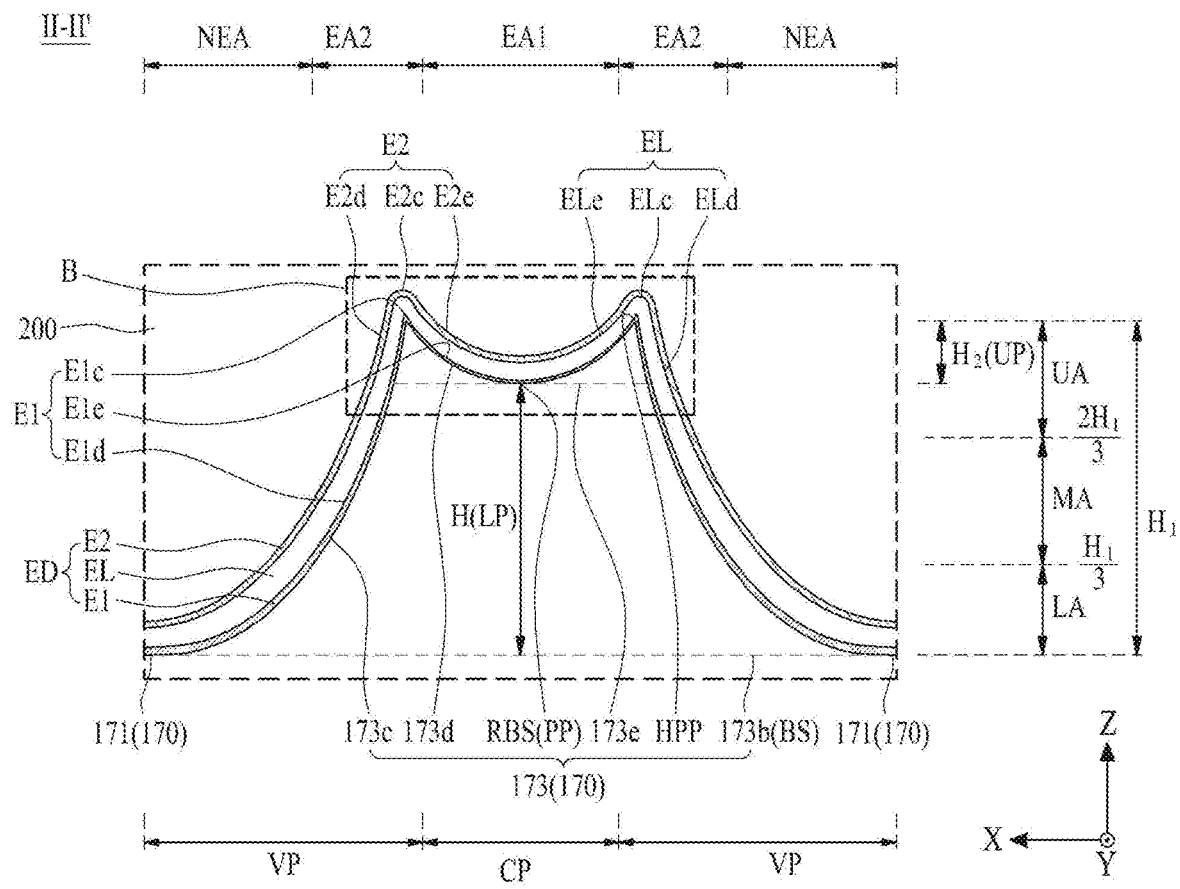
FIG. 9 is a sectional view taken along line II-II' in FIG. 5.
Figure 10:
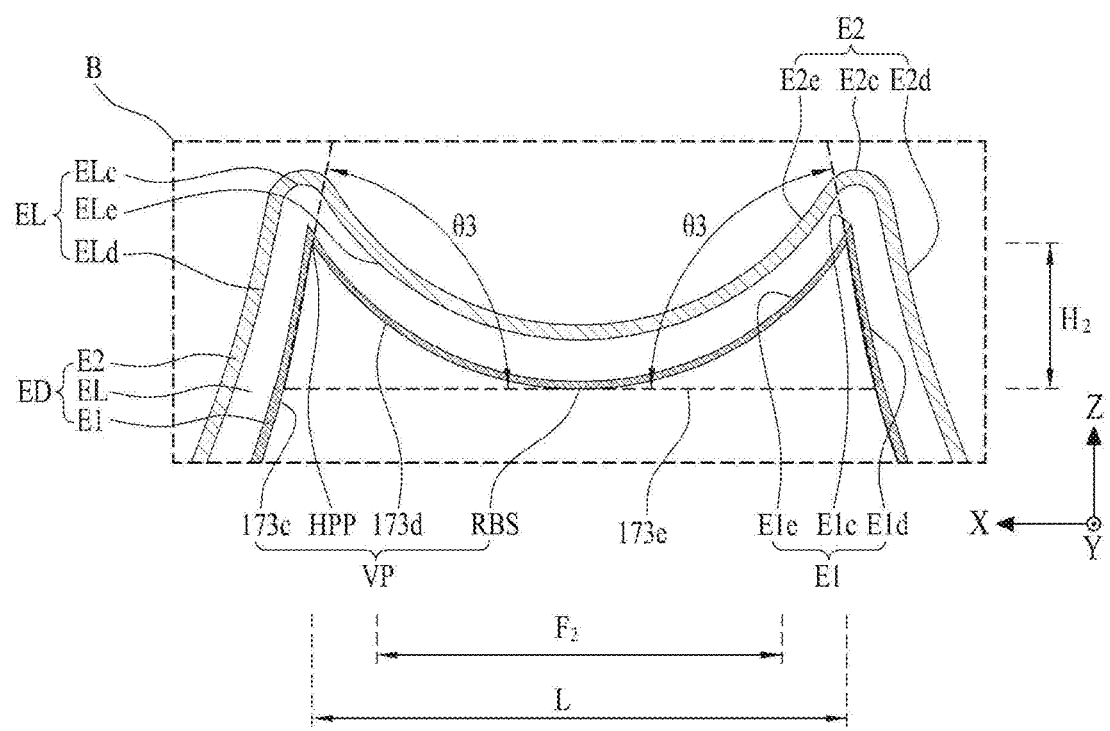
FIG. 10 is an enlarged view of part B illustrated in FIG. 9.

FIG. 9 is a sectional view taken along line II-II' in FIG. 5. FIG. 10 is an enlarged view of part B illustrated in FIG. 9. These drawings are diagrams illustrating sectional structures of a vertex portion and a connection portion of a protruding portion and a light emitting element which are provided over the uneven portion according to the present disclosure.

Referring to FIGS. 5 to 10, the vertex portion VP of the protruding portion 173 provided in the uneven portion 170 according to the embodiment of the present disclosure includes a sharp structure between three neighboring concave portions 171 and thus extracts light, which is not externally extracted due to repeated total reflection in the light emitting layer EL, to the outside. In this case, the shape of the vertex portion VP is determined depending on the shape of the connection portion CP.

The vertex portion VP according to an embodiment may include a highest peak portion HPP having a sharp structure, a first inclined surface 173c between the highest peak portion HPP and the concave portion 171, and a first ridge portion 173*d* between the highest peak portion HPP and the peak portion PP of the connection portion CP.

The highest peak portion HPP has a sharp structure protruding sharp in the middle between three neighboring concave portions 171. In this case, the highest peak portion HPP is formed to be higher than the peak portion PP of the connection portion CP. The highest peak portion HPP according to an embodiment is formed with a first height $H_1$ from the bottom surface 173*b* (or BS) of the protruding portion 173, and thus the tip (or end) of the highest peak portion HPP has a sharp shape and is located at the highest position in the uneven portion 170.

The first inclined surface 173*c* is formed to be concave between the highest peak portion HPP and the concave portion 171. In this case, the first inclined surface 173*c* is formed in a concave curved shape between the highest peak portion HPP and the bottom surface BS of the concave portion 171. The first inclined surface 173*c* has a tangent slope which increases gradually from the bottom surface BS of the concave portion 171 to the highest peak portion HPP, and thus the tip (or end) of the highest peak portion HPP has a sharp structure.

The first ridge portion 173*d* is formed to be concave between the highest peak portion HPP and the peak portion PP of the connection portion CP. In this case, the first ridge portion 173*d* is formed in a concave curved shape between two neighboring vertex portions VP with the connection portion CP interposed therebetween. Accordingly, the protruding portion 170 further includes the first ridge portion 173*d* which is provided to be concave between two neighboring vertex portions VP. For example, the first ridge portion 173*d* has a concave sectional structure and thus may be referred to as a recessed portion.

The first ridge portion 173*d* according to an embodiment includes a ridge bottom surface RBS corresponding to the middle of the connection portion CP which is provided between two neighboring vertex portions VP. The ridge bottom surface RBS may be an end of the peak portion PP of the connection portion CP that is provided in the middle between two neighboring vertex portions VP. For example, the ridge bottom surface RBS may correspond to an end of the peak portion PP which is located at the smallest height from the bottom surface 173*b* of the protruding portion 173 in the peak portion PP of the connection portion CP provided between two neighboring vertex portions VP. In this case, the height between the bottom surface 173*b* of the protruding portion 173 and the ridge bottom surface RBS is the same as the total height H between the peak portion PP of the connection portion provided in the middle between two neighboring vertex portions VP and the bottom surface 173*b* of the protruding portion 173.

The vertex portion VP according to an embodiment may include a lower side portion LP and an upper side portion UP which are defined with respect to the ridge bottom surface RBS.

The lower side portion LP is defined as an area located below an extension line extending from the ridge bottom surface RBS in the vertex portion VP with respect to the height of the vertex portion VP. In this case, the lower side portion LP may be defined as an area between the bottom surface 173*b* of the protruding portion 173 and the ridge bottom surface RBS.

The upper side portion UP is defined as an area located above the external line extending from the ridge bottom surface RBS in the vertex portion VP with respect to the height of the vertex portion VP. In this case, the upper side portion UP of the vertex portion VP is defined as an area between the ridge bottom surface RBS and the highest peak portion HPP and has a second height H2. The upper side portion UP of the vertex portion VP is connected to three neighboring connection portions CP and thus three-dimensionally has a triangular pyramid having concave side surfaces.

The vertex portion VP according to an embodiment may include a lower area LA, a middle area MA, and an upper area UA which are defined with respect to the first height $H_1$ between the bottom surface 173*b* of the protruding portion 173 and the highest peak portion HPP. The lower area LA of the vertex portion VP may be defined as an area between the bottom surface 173*b* of the protruding portion 173 and a 1/3-height ($H_1/3$) position of the first height $H_1$. The middle area MA of the vertex portion VP may be defined as an area between the 1/3-height ($H_1/3$) position and a 2/3-height ($2H_1/3$) position with respect to the first height $H_1$. The upper area UA of the vertex portion VP may be defined as an area between the 2/3-height ($2H_1/3$) position with respect to the first height $H_1$ and the highest peak portion HPP.

An angle θ3 between an extension line 173*e* extending from the ridge bottom surface RBS and the highest peak portion HPP of the vertex portion VP affects an emission spectrum at the vertex portion VP and external extraction efficiency of light. According to an embodiment, the angle θ3 between the highest peak portion HPP and the ridge bottom surface RBS of the first inclined surface 173*c* may be set to be equal to or greater than 15 degrees and less than 75 degrees. In this case, an emission spectrum in which a micro cavity at the first inclined surface 173*c* and a microcavity at the first ridge portion 173*d* match each other is generated and thus it is possible to improve emission efficiency and to improve external extraction efficiency of light.

When the angle θ3 between the ridge bottom surface RBS and the highest peak portion HPP of the vertex portion VP is less than 15 degrees, the first inclined surface 173*c* provided in the upper side portion UP of the vertex portion VP has a small slope, and thus the highest peak portion HPP of the vertex portion VP has an unsharp convex curved shape. Accordingly, light emitted from the light emitting element ED over the vertex portion VP is not externally extracted but is trapped in the light emitting element ED, whereby light extraction efficiency may decrease. When the angle θ3 between the ridge bottom surface RBS and the highest peak portion HPP of the vertex portion VP is greater than 75 degrees, the first inclined surface 173*c* provided in the upper side portion UP of the vertex portion VP has a large slope, and thus asymmetry between the slope of the first inclined surface 173*c* and the slope of the first ridge portion 173*d* increases much. Accordingly, an emission spectrum in which a microcavity at the first inclined surface 173*c* and a microcavity at the first ridge portion 173*d* do not match each other is generated and thus emission efficiency may decrease.

Since the first electrode E1 of the light emitting element ED which is provided on the vertex portion VP of the protruding portion 173 is in contact with the surface of the vertex portion VP and has a relatively small thickness, the first electrode E1 has a contour which conforms to the contour of the vertex portion VP. For example, the first electrode E1 over the vertex portion VP is formed to cover (or to overlay) the vertex portion VP in a conformal manner through a process of depositing a transparent conductive material. According to an embodiment, the first electrode E1 over the vertex portion VP may include a third sharp portion E1*c* having a sharp shape that is formed over the highest peak portion HPP of the vertex portion VP, a second inclined surface E1*d* having a concave curved shape that is formed over the first inclined surface 173*c* of the vertex portion VP, and a second ridge portion E1*e* having a concave curved shape that is formed over the first ridge portion 173*d* of the vertex portion VP. In this case, the second inclined surface E1*d* is formed to be conformal to the first inclined surface 173*c* of the vertex portion VP, and the second ridge portion E1*e* is also formed to be conformal to the first ridge portion 173*d* of the vertex portion VP.

The light emitting layer EL of the light emitting element ED provided over the vertex portion VP according to the present disclosure may have a thickness which increases gradually from the upper area UA to the lower area LA depending on the shape of the vertex portion VP. In this case, similarly to the light emitting layer EL over the connection portion CP, the light emitting layer EL over the vertex portion VP may have the smallest thickness in the upper side portion UP having a relatively large tangent slope and has the largest thickness in the lower area LA having a relatively small tangent slope (or a relatively slow slope).

The light emitting layer EL over the vertex portion VP according to the present disclosure is formed to be non-conformal to the first electrode E1 over the vertex portion VP. According to an embodiment, the light emitting layer EL over the vertex portion VP includes a second uplifted portion ELc that overlaps the highest peak portion HPP of the vertex portion VP (or the third sharp portion E1*c* of the first electrode E1), a third inclined surface ELd that overlaps the first inclined surface 173*c* of the vertex portion VP (or the second inclined surface E1*d* of the first electrode E), and a third ridge portion ELe that overlaps the first ridge portion 173*d* of the vertex portion VP (or the second ridge portion E1*e* of the first electrode E1).

The second uplifted portion ELc is formed to be convex in a non-conformal shape which is non-conformal to the highest peak portion HPP having a sharp structure of the vertex portion VP. In this case, the second uplifted portion ELc protrudes convexly from the third inclined surface ELd and the third ridge portion ELe to overlap the highest peak portion HPP of the vertex portion VP and covers (or overlays) the highest peak portion HPP of the vertex portion VP. The second uplifted portion ELc may be referred to as a convex protrusion.

The second uplifted portion ELc is formed to have a curvature for preventing light, which is totally reflected in the light emitting layer EL by emission of light from the light emitting layer EL and is incident thereon, from being totally reflected again in the light emitting layer EL. The second uplifted portion ELc according to an embodiment may include a dome or bell structure having a convex sectional shape. The second uplifted portion ELc reflects light, which is totally reflected in the light emitting layer EL by emission of light from the light emitting layer EL and is incident thereon, toward the substrate and enhance external extraction efficiency of light emitted from the light emitting layer EL. For example, the second uplifted portion ELc serves as a concave lens that reflects light, which is emitted in the second effective emission area EA2 of the light emitting element ED provided between three neighboring concave portions 171 and is incident thereon, toward the substrate.

The third inclined surface ELd is formed over the second inclined surface E1*d* of the first electrode E1. The light emitting layer EL including the third inclined surface ELd is formed to have a thickness that increases gradually from the highest peak portion HPP of the vertex portion VP to the bottom surface BS of the concave portion 171 depending on the slope of the first inclined surface 173*c* of the vertex portion VP. In this case, the third inclined surface ELd of the light emitting layer EL has a first thickness over the upper side portion UP of the vertex portion VP and a second thickness greater than the first thickness over the bottom surface BS of the concave portion 171. Accordingly, the light emitting layer EL over the vertex portion VP strongly emits light over the upper side portion UP with a high current density due to the first thickness which is relatively small and thus has high light extraction efficiency. On the other hand, the light emitting layer EL over the vertex portion VP weakly emits light over the lower side portion LA of the vertex portion VP and the bottom surface BS of the concave portion 171 having a low current density due to the second thickness which is relatively large and thus reduces power consumption.

The third ridge portion ELe is formed over the second ridge portion E1*e* of the first electrode E1. In this case, the light emitting layer EL including the third ridge portion ELe is formed to have a thickness which increases gradually from the highest peak portion HPP of the vertex portion VP to the ridge bottom surface RBS depending on the slope of the first ridge portion 173*d* of the vertex portion VP.

When the light emitting layer includes an organic light emitting layer, emission of light from the light emitting element ED occurs mainly in an area with a high current density. In the light emitting element ED over the vertex portion VP according to the present disclosure, relatively strong emission of light occurs due to a relatively high current density in the upper area UA and the middle area MA of the vertex portion VP with a relatively small thickness, and relatively weak (or insignificant) emission of light occurs due to a relatively low current density in the lower area LA of the vertex portion VP with a relatively large thickness. Accordingly, the upper area UA and the middle area MA of the vertex portion VP may be defined a second effective emission area EA2 (or a second partial emission area) in the opening area OA, and the lower area LA of the vertex portion VP may be defined as a non-effective emission area NEA (or a non-emission area) in the opening area OA. Here, since the highest peak portion HPP of the vertex portion VP has a shape higher and sharper than that of the peak portion PP of the connection portion CP, the light emitting layer EL which is formed over the upper side portion UP of the vertex portion VP has a thickness smaller than that of the light emitting layer EL which is formed over the peak portion PP of the connection portion CP. Accordingly, since stronger emission of light occurs in the second effective emission area EA2 over the vertex portion VP than in the first effective emission area EA1 over the connection portion CP, the second effective emission area EA2 has higher luminance than the first effective emission area EA.

The second electrode E2 of the light emitting element ED which is provided over the vertex portion VP according to the present disclosure is in contact with the surface of the light emitting layer EL over the vertex portion VP and has a thickness smaller than that of the light emitting layer EL, and thus has a contour which conforms to the contour of the light emitting layer EL over the vertex portion VP. For example, the second electrode E2 over the vertex portion VP includes a second dome portion E2*c* which is convex to overlap the second uplifted portion ELc of the light emitting layer EL, a fourth inclined surface E2*d* that is formed over the third inclined surface ELd of the light emitting layer EL, and a fourth ridge portion E2*e* that is formed over the third ridge portion ELe of the light emitting layer EL. The second electrode E2 over the vertex portion VP reflects light which is incident from the light emitting element ED over the vertex portion VP toward the substrate, whereby it is possible to prevent total reflection of the incident light and thus to improve light extraction efficiency of the pixel.

In the light emitting display device according to the present disclosure, emission efficiency of the light emitting element ED may be determined depending on the shape of the protruding portion 173 and light extraction efficiency may be determined depending on the shape of the protruding portion 173 and the shape of the light emitting element ED. A current efficiency enhancement of the light emitting display device according to the present disclosure increases as the emission efficiency of the light emitting element ED increases. Accordingly, the shape of the protruding portion 173 serves as a parameter for determining the emission efficiency, the light extraction efficiency, and the current efficiency enhancement of the light emitting display device. Examples of the parameter for determining the shape of the protruding portion 173 may include an aspect ratio AR1 of the connection portion CP, a half-height aspect ratio F1_AR, a half-height sharpness Rm1, a 4/5-height aspect ratio F'_AR, an aspect ratio AR2 of the ridge portion 173d (or the recessed portion), a half-height aspect ratio F2_AR, a height ratio RH, a half-height sharpness Rm2, and a slope of the highest peak portion HPP.

The aspect ratio AR1 of the connection portion CP refers to a ratio of a height H to a half diameter D/2 of the connection portion CP and is defined as a value H/(D/2) obtained by dividing the height H by the half diameter D/2 of the bottom side. Here, the half diameter D/2 of the connection portion CP is defined as a half diameter of the bottom surface to the section of the connection portion CP, and the height H is defined as a height between the bottom surface 173b of the protruding portion 173 and the peak portion PP of the connection portion CP.

The half-height aspect ratio F1_AR of the connection portion CP refers to a ratio of the height H to a half-height width (Full Width Half Max) $F_1$ of the connection portion CP and is defined as a value $(H/2)/(F_1/2)$ obtained by dividing the half height H/2 by the half diameter $F_1/2$ at the half-height (H/2) position or is defined as a value $H/F_1$ obtained by dividing the height H by the half-height width $F_1$. In this case, the half-height width $F_1$ is defined as a width of a bottom side at the half-height (H/2) position with respect to the height H and the half diameter $F_1/2$ at the half-height (H/2) position is defined as a half of the half-height width $F_1$.

The half-height sharpness Rm1 of the connection portion CP refers to a ratio of the half-height aspect ratio F1_AR to the aspect ratio AR1 and is defined as a value F1_AR/AR1 obtained by dividing the half-height aspect ratio F1_AR by the aspect ratio AR1. Alternatively, the half-height sharpness Rm1 of the connection portion CP refers to a ratio of the diameter D to double the half-height width $F_1$ and is defined as a value $D/2F_1$ obtained by dividing the diameter D by double the half-height width $F_1$.

The 4/5-height aspect ratio F'_AR of the connection portion CP is an aspect ratio for the width F1 at the 4/5-height (4H/5) position, refers to a ratio of the 4/5 height 4H/5 to the half width F'/2 at the 4/5-height (4H/5) position, and is defined as a value (4H/5)/(F/2) obtained by dividing the 4/5 height 4H/5 by the half width F'/2 at the 4/5-height (4H/5) position. In this case, the 4/5-height width F1 is defined as a half width (or a half diameter) of the connection portion at the 4/5-height (4H/5) position (80% point) of the total height H of the connection portion CP with respect to the bottom surface 173b (or the bottom side) of the protruding portion 173.

In the protruding portion 173 according to the present disclosure, a parameter for determining the shape of the peak portion PP of the connection portion CP is the 4/5-height aspect ratio F'_AR. Accordingly, the 4/5-height aspect ratio F'_AR of the connection portion according to the present disclosure ranges from 0.35 to 0.6. In this case, the connection portion CP has a 4/5-height aspect ratio F'_AR in the range of 0.35 to 0.6 and thus has a peak portion PP of a sharp structure.

When the 4/5-height aspect ratio F'_AR of the connection portion CP ranges from 0.35 to 0.6, the light extraction efficiency increases in comparison with a case in which the 4/5-height aspect ratio F'_AR of the connection portion CP is less than 0.35 or greater than 0.6. For example, when the 4/5-height aspect ratio F'_AR of the connection portion CP is greater than 0.6, the tangent slope in the upper area UA of the connection portion CP increases as the height H of the connection portion CP increases and an amount of light trapped in the light emitting element ED increases to reduce the light extraction efficiency. When the 4/5-height aspect ratio F'_AR of the connection portion CP is less than 0.35, the height h3 of the upper area UA of the connection portion CP becomes excessively low or becomes flattened to form a waveguide and light emitted from the light emitting element ED does not propagate toward the substrate, repeats total reflection, and is trapped in the light emitting element ED to reduce the light extraction efficiency. Particularly, when the 4/5-height aspect ratio F'_AR of the connection portion CP is less than 0.35, the peak portion PP of the connection portion CP has a sectional structure which is unsharp and has a bell shape or a Gaussian curve shape. In this case, since the light emitting element ED has a contour which conforms to the contour the connection portion CP, the first uplifted portion ELa is not formed and an effect of the first uplifted portion ELa cannot be expected.

When the 4/5-height aspect ratio F'_AR of the connection portion CP ranges from 0.35 to 0.6, the shape of the connection portion CP varies depending on the aspect ratio AR1, the half-height aspect ratio F1_AR1, and the half-height sharpness Rm1.

The aspect ratio AR2 of the ridge portion 173d refers to a ratio of the second height $H_2$ to the half distance L/2 (or half diameter) of the ridge portion 173d and is defined as a value $H_2/(L/2)$ obtained by dividing the second height $H_2$ by the half distance L/2 of the ridge portion 173d. In this case, the half distance L/2 of the ridge portion 173d is defined as a half distance L/2 between two neighboring highest peak portions HPP with the connection portion CP, and the second height H2 is defined as a height between the highest peak portion HPP and the ridge bottom surface RBS.

The half-height aspect ratio F2_AR of the ridge portion 173d refers to a ratio of the second height $H_2/2$ to the half-height width $F_2$ of the ridge portion 173d and is defined as a value $(H_2/2)/(F_2/2)$ obtained by dividing the half height $H_2/2$ of the second height H2 by the half diameter $F_2/2$ at the half-height $(H_2/2)$ position or is defined as a value $H_2/F_2$ obtained by dividing the second height $H_2$ by the half-height width $F_2$. In this case, the half-height width $F_2$ is defined as a shortest distance between the first ridge portions 173d of two neighboring vertex portions VP at the half-height $(H_2/2)$ position of the second height $H_2$.

The height ratio RH of the ridge portion 173d refers to a ratio of the first height $H_1$ to the second height $H_2$ and is defined as a value $H_1/H_2$ by dividing the first height $H_1$ by the second height $H_2$. In this case, the first height H1 is defined as the total height of the vertex portion VP with respect to the bottom surface 173b (or the bottom side) of the protruding portion 173 and is also defined as the total height between the bottom surface 173b and the highest peak portion HPP of the protruding portion 173.

The half-height sharpness Rm2 of the ridge portion 173d refers to a ratio of the half-height aspect ratio F2_AR to the aspect ratio AR2 and is defined as a value F2_AR/AR2 obtained by dividing the half-height aspect ratio F2_AR by the aspect ratio AR2. Alternatively, the half-height sharpness Rm2 of the ridge portion 173d refers to a ratio of the distance L (or the diameter) of the ridge portion 173d to double the half-height width $F_2$ and is defined as a value $L/2F_2$ obtained by dividing the distance L of the ridge portion 173d by double the half-height width $F_2$.

The slope of the highest peak portion HPP refers to a tangential value of an angle θ3 between the ridge bottom surface RBS and the highest peak portion HPP of the vertex portion VP and the angle θ3 is set to be equal to or greater than 15 degrees and less than 75 degrees.

In the protruding portion 173 according to the present disclosure, the upper side portion UP of the vertex portion VP is formed to include the highest peak portion HPP depending on the shape of the connection portion CP.

In the vertex portion VP according to the present disclosure, the height ratio RH of the ridge portion 173d may be set to be greater than 0.1 and less than 0.3 (0.1<RH<0.3). When the height ratio RH of the ridge portion 173d is less than 0.1, the upper side portion UP of the vertex portion VP is excessively lowered and the ridge portion 173d has a slow slope to form waveguides and thus light emitted from the light emitting element ED does not propagate to the substrate and is repeatedly totally reflected. The height ratio RH of the ridge portion 173d with a value of 0.1 may be a value at which the ridge portion 173d is formed concave and external extraction of light in the ridge portion 173d is started. The height ratio RH of the ridge portion 173d with a value of 0.3 may be a value at which the highest peak portion HPP is formed in the vertex portion VP while maintaining the aspect ratio AR1 of the connection portion CP set to increase external extraction efficiency of light in the connection portion CP.

The aspect ratio AR2 of the ridge portion 173d may be greater than 0.05 and less than 0.4 depending on the shape of the connection portion CP (0.05<AR2<0.4). In this case, the aspect ratio AR2 of the ridge portion 173d with a value of 0.05 may be a value at which external extraction of light in the ridge portion 173d is started. The aspect ratio AR2 of the ridge portion 173d with a value of 0.4 may be a value at which external extraction of light in the ridge portion 173d is maximized while maintaining the aspect ratio AR1 of the connection portion CP set to increase the external extraction efficiency of light in the connection portion CP.

The half-height sharpness Rm2 of the ridge portion 173d may be greater than 0.625 and less than 1 depending on the aspect ratio AR2 (0.625<Rm2<1). Here, when the aspect ratio AR2 of the ridge portion 173d is 0.4, the half-height sharpness Rm2 of the ridge portion 173d may be 0.625. When the aspect ratio AR2 of the ridge portion 173d is 0.05, the half-height sharpness Rm2 of the ridge portion 173d may be 1.

The half-height aspect ratio F2_AR of the ridge portion 173d may be greater than 0.05 and less than 0.25 depending on the shape of the connection portion CP (0.05<F2_AR2<0.25). Here, the half-height aspect ratio F2_AR of the ridge portion 173d with a value of 0.05 may be a value at which external extraction of light in the ridge portion 173d is started. The half-height aspect ratio F2_AR of the ridge portion 173d with a value of 0.25 may be a value at which external extraction of light in the ridge portion 173d is maximized while maintaining the aspect ratio AR1 of the connection portion CP set to increase the external extraction efficiency of light in the connection portion CP.

Figure 11A:
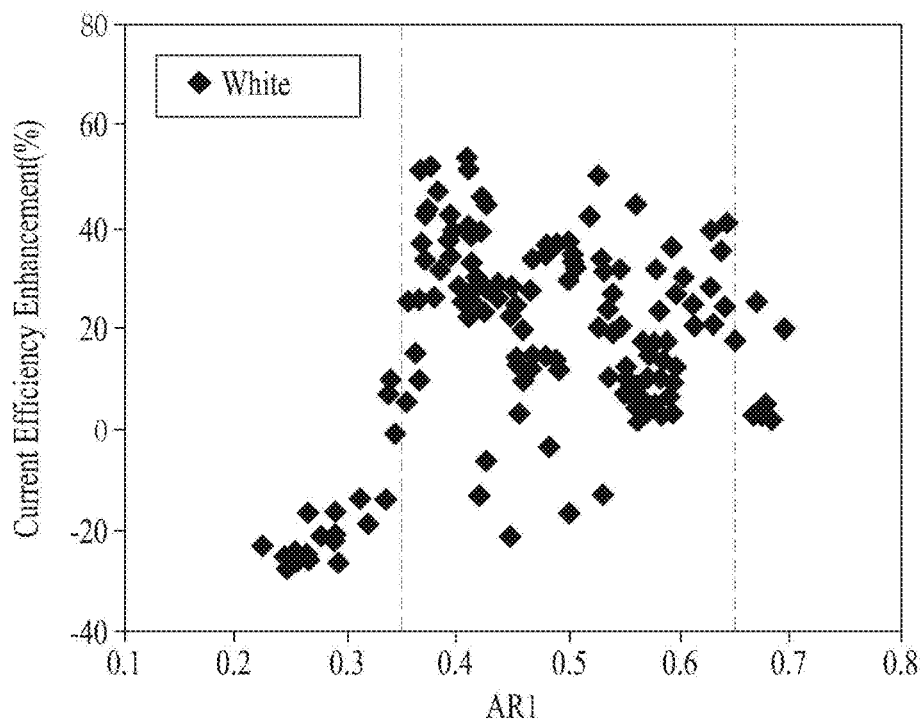
FIG. 11A is a graph illustrating a current efficiency enhancement of a white pixel corresponding to an aspect ratio of a connection portion provided in a protruding portion in the light emitting display device according to the present disclosure.
Figure 11B:
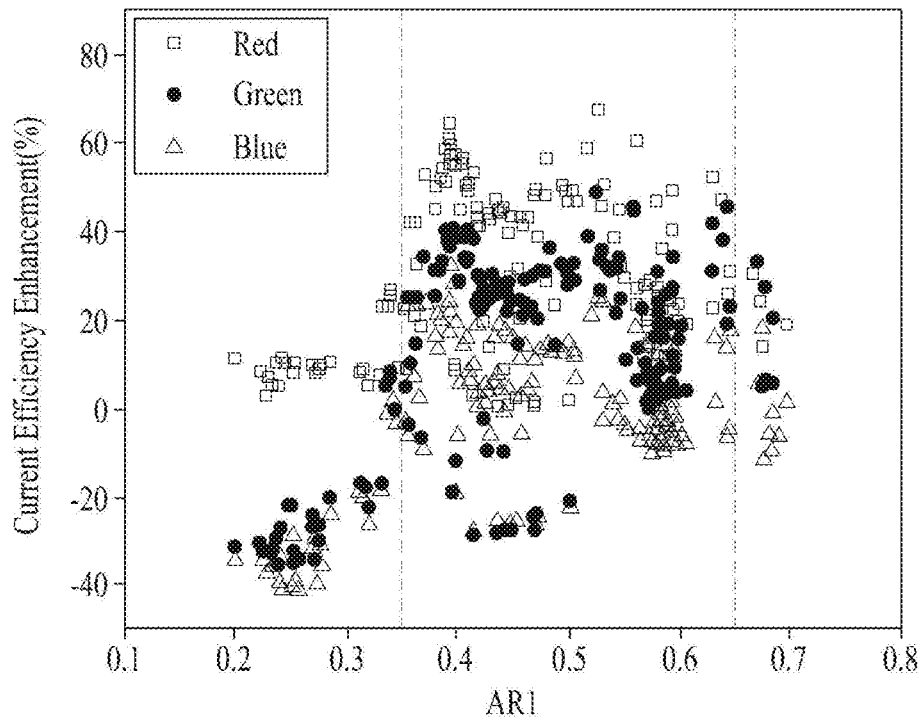
FIG. 11B is a graph illustrating current efficiency enhancements of a red pixel, a green pixel, and a blue pixel corresponding to an aspect ratio of a connection portion in the light emitting display device according to the present disclosure.

FIG. 11A is a graph illustrating a current efficiency enhancement of a white pixel corresponding to an aspect ratio of a connection portion provided in a protruding portion in the light emitting display device according to the present disclosure. FIG. 11B is a graph illustrating current efficiency enhancements of a red pixel, a green pixel, and a blue pixel corresponding to an aspect ratio of a connection portion in the light emitting display device according to the present disclosure.

Referring to FIG. 6 and FIGS. 11A and 11B, when the aspect ratio AR1 of the connection portion CP in each pixel of the light emitting display device according to the present disclosure ranges from 0.35 to 0.65, it may be ascertained that the current efficiency enhancement is more excellent when the aspect ratio AR1 of the connection portion CP is less than 0.35 or greater than 0.65. In this case, it may be ascertained that the current efficiency enhancement of the light emitting element ED has tendency to decrease when the aspect ratio AR1 of the connection portion CP is greater than 0.65 and has a maximum value when the aspect ratio AR1 of the connection portion CP ranges from 0.35 to 0.65.

When the aspect ratio AR1 of the connection portion CP is less than 0.35, the height H of the connection portion CP is excessively decreased or the connection portion CP is flattened to form waveguides and thus light emitted from the light emitting element ED does not propagate to the substrate, is repeatedly totally reflected, and is trapped in the light emitting element ED, whereby the light extraction efficiency may be decreased. When the aspect ratio AR1 of the connection portion CP is greater than 0.65, the height H of the connection portion CP is excessively increased, the aspect ratio AR1 decreases, reflectance of external light increases, whereby black luminance cannot be realized.

Accordingly, when the aspect ratio AR1 of the connection portion CP range from 0.35 to 0.65, a maximum current efficiency enhancement may be achieved and the light emitting element ED can have a maximum emission efficiency in this case.

Figure 12A:
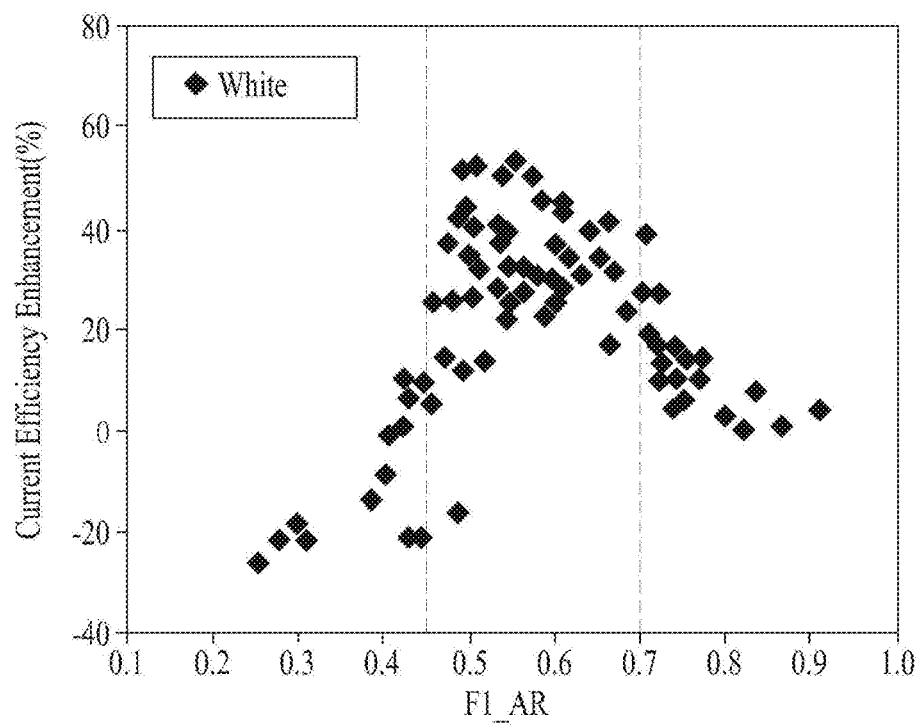
FIG. 12A is a graph illustrating a current efficiency enhancement of a white pixel corresponding to a half-height aspect ratio of a connection portion in the light emitting display device according to the present disclosure.
Figure 12B:
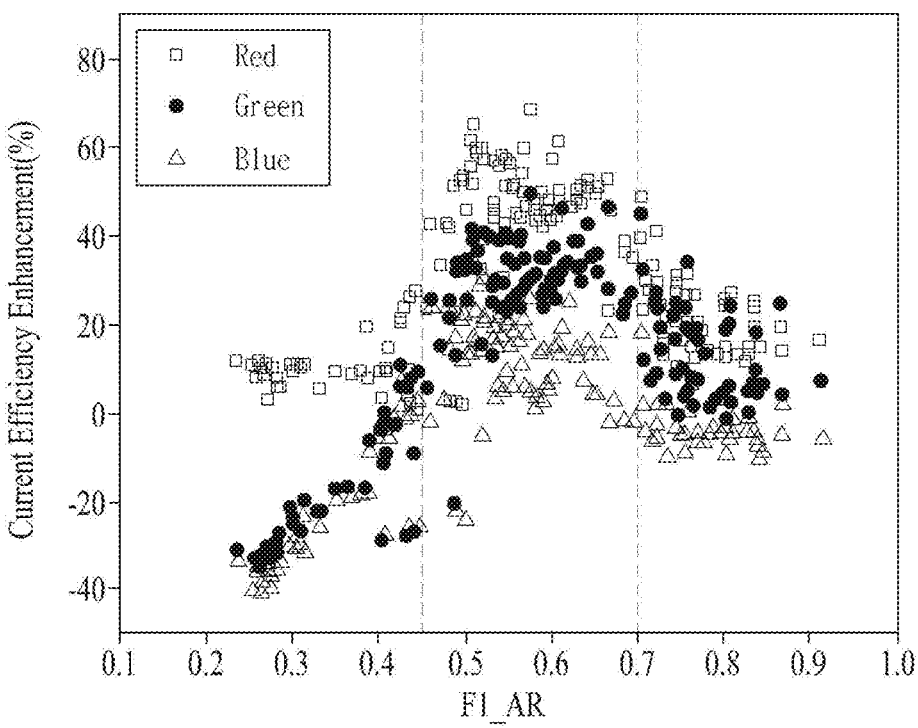
FIG. 12B is a graph illustrating current efficiency enhancements of a red pixel, a green pixel, and a blue pixel corresponding to a half-height aspect ratio of a connection portion in the light emitting display device according to the present disclosure.

FIG. 12A is a graph illustrating a current efficiency enhancement of a white pixel corresponding to a half-height aspect ratio of a connection portion in the light emitting display device according to the present disclosure. FIG. 12B is a graph illustrating current efficiency enhancements of a red pixel, a green pixel, and a blue pixel corresponding to a half-height aspect ratio of a connection portion in the light emitting display device according to the present disclosure.

Referring to FIGS. 12A and 12B along with FIG. 6, when the half-height aspect ratio F1_AR of the connection portion CP in each pixel of the light emitting display device according to the present disclosure ranges from 0.45 to 0.7, it may be ascertained that the current efficiency enhancement is more excellent than when the half-height aspect ratio F1_AR of the connection portion CP is less than 0.45 or greater than 0.7. In this case, it may be seen that the current efficiency enhancement of the light emitting element ED has a tendency to decrease when the half-height aspect ratio F1_AR of connection portion CP is greater than 0.7 and has a maximum value when the half-height aspect ratio F1_AR of the connection portion CP ranges from 0.45 to 0.7.

When the half-height aspect ratio F1_AR of the connection portion CP is less than 0.45, the height h2+h3 of the middle area MA and the upper area UA of the connection portion CP is excessively decreased or the areas are flattened to form waveguides and thus light emitted from the light emitting element ED does not propagate to the substrate, is repeatedly totally reflected, and is trapped in the light emitting element ED, whereby the light extraction efficiency may be decreased. When the half-height aspect ratio F1_AR of the connection portion CP is greater than 0.7, the height H of the connection portion CP is excessively increased, the half-height aspect ratio F1_AR is decreased, and reflectance of external light is increased, whereby black luminance cannot be realized.

Accordingly, when the half-height aspect ratio F1_AR of the connection portion CP ranges from 0.45 to 0.7, a maximum current efficiency enhancement may be achieved and the light emitting element ED can have a maximum emission efficiency in this case.

On the other hand, in each pixel of the light emitting display device according to the present disclosure, when the half-height sharpness Rm1 of the connection portion CP is 1, the connection portion CP has a triangular section. When the half-height sharpness Rm1 of the connection portion CP is less than 1, the connection portion CP has a semicircular section. When the half-height sharpness Rm1 of the connection portion CP is greater than 1, the connection portion CP has a bell-shaped section. Accordingly, the half-height sharpness Rm1 of the connection portion CP according to the present disclosure ranges from 1.1 to 1.3 such that the maximum tangent slope of the first curved portion 173a is located between the middle area MA and the upper area UA of the connection portion CP. When the half-height sharpness Rm1 of the connection portion CP is less than 1.1, the peak portion PP of the connection portion CP has an unsharp sectional structure of a bell shape or a Gaussian curve, whereby the first uplifted portion ELa is not formed in the light emitting layer EL formed over the peak portion PP of the connection portion CP and thus an effect based on the first uplifted portion ELa cannot be expected. When the half-height sharpness Rm1 of the connection portion CP is greater than 1.3, the width of the upper area UA of the connection portion CP is decreased and the peak portion PP of the connection portion CP cannot be formed to be sharp.

Figure 13A:
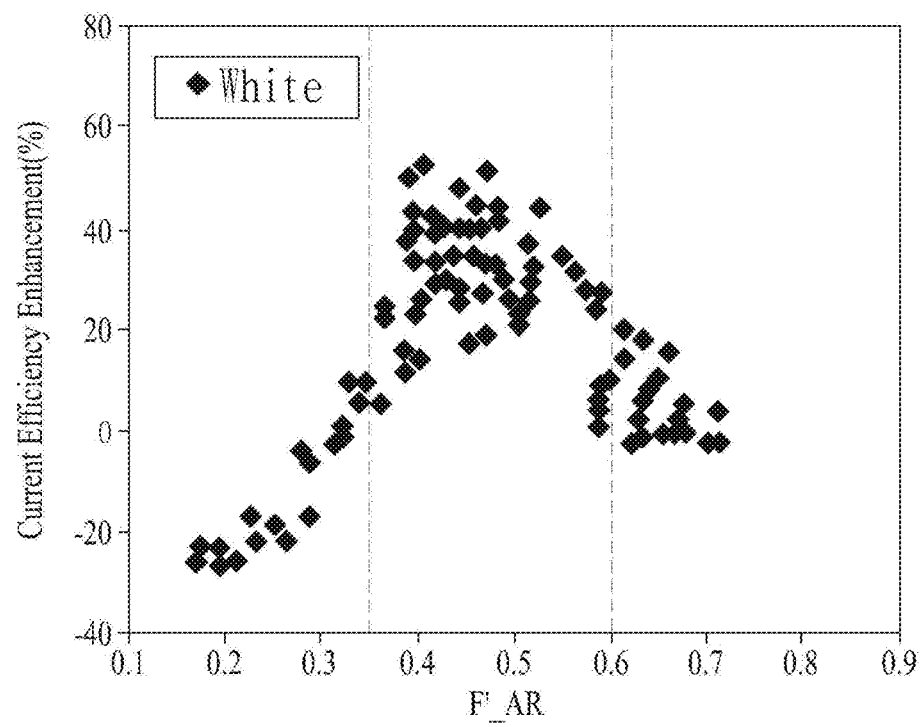
FIG. 13A is a graph illustrating a current efficiency enhancement of a white pixel corresponding to a 4/5-height aspect ratio of a connection portion in the light emitting display device according to the present disclosure.
Figure 13B:
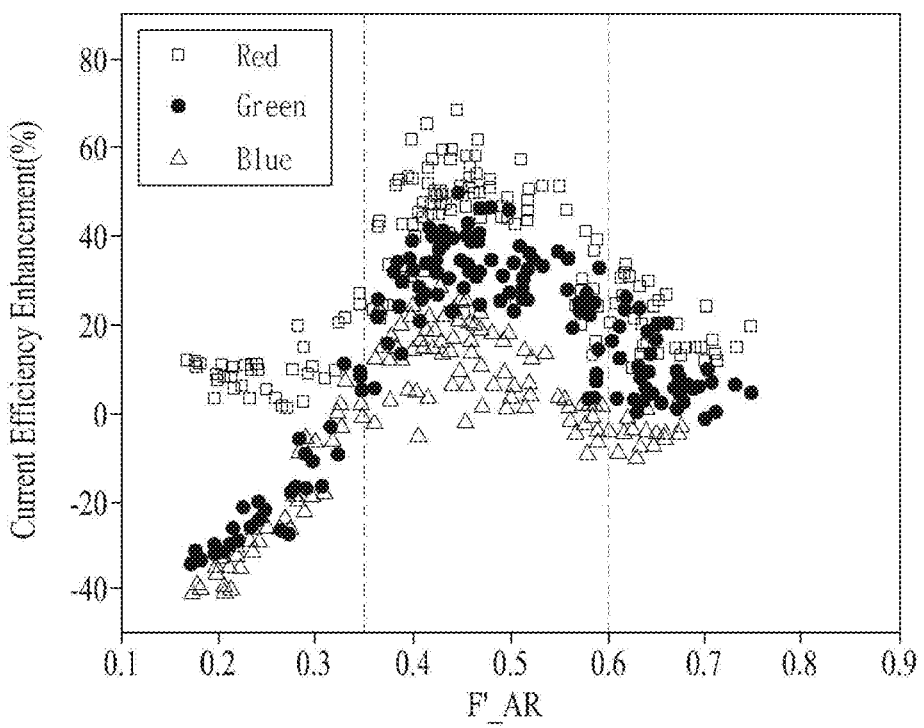
FIG. 13B is a graph illustrating current efficiency enhancements of a red pixel, a green pixel, and a blue pixel corresponding to a 4/5-height aspect ratio of a connection portion in the light emitting display device according to the present disclosure.

FIG. 13A is a graph illustrating a current efficiency enhancement of a white pixel corresponding to a 4/5-height aspect ratio of a connection portion in the light emitting display device according to the present disclosure. FIG. 13B is a graph illustrating current efficiency enhancements of a red pixel, a green pixel, and a blue pixel corresponding to a 4/5-height aspect ratio of a connection portion in the light emitting display device according to the present disclosure.

Referring to FIGS. 13A and 13B along with FIG. 6, when the 4/5-height aspect ratio F'_AR of the connection portion CP ranges from 0.35 to 0.6 in each pixel of the light emitting display device according to the present disclosure, it may be ascertained that the current efficiency enhancement is more excellent than that when the 4/5-height aspect ratio F'_AR of the connection portion CP is less than 0.35 or greater than 0.76. In this case, it may be ascertained that the current efficiency enhancement of the light emitting element ED has a tendency to decrease when the 4/5-height aspect ratio F'_AR of the connection portion CP is greater than 0.6 and has a maximum value when the 4/5-height aspect ratio F'_AR of the connection portion CP ranges from 0.35 to 0.6.

Accordingly, when the 4/5-height aspect ratio F'_AR of the connection portion CP according to the present disclosure ranges from 0.35 to 0.6, a maximum current efficiency enhancement may be achieved and the light emitting element ED can have a maximum emission efficiency in this case. For example, when the 4/5-height aspect ratio F'_AR of the connection portion CP ranges from 0.4 to 0.5, a white pixel has a maximum current efficiency enhancement of about 50%, a red pixel has a maximum current efficiency enhancement of about 70%, a green pixel has a maximum current efficiency enhancement of about 50%, and a blue pixel has a maximum current efficiency enhancement of about 30%.

As a result, the connection portion CP according to the present disclosure has a 4/5-height aspect ratio F'_AR in the range of 0.35 to 0.6 such that the peak portion PP has a sharp structure, and has a half-height sharpness Rm1 in the range of 1.1 to 1.3 such that the first effective emission area of the light emitting element ED is located in the upper portion of the connection portion CP. For example, the connection portion CP may have an aspect ratio AR1 in the range of 0.35 to 0.65 and a half-height aspect ratio F1_AR in the range of 0.45 to 0.7 such that the half-height sharpness Rm1 ranges from 1.1 to 1.3, the upper side portion of the vertex portion includes a highest peak portion, an inclined portion, and a ridge portion depending on the shape of the connection portion CP.

Figure 14:
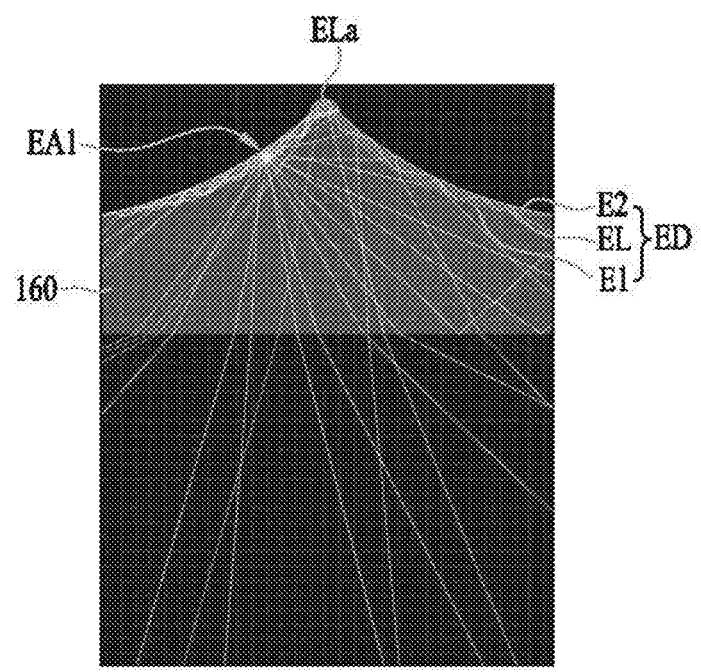
FIG. 14 is a simulation diagram illustrating an optical path corresponding to shapes of a connection portion and a light emitting layer according to an example of the present disclosure.

FIG. 14 is a simulation diagram illustrating an optical path corresponding to the shapes of a connection portion and a light emitting layer according to an example of the present disclosure.

Referring to FIG. 14, the peak portions of the connection portion and the light emitting layer according to an example of the present disclosure have different shapes (or non-conformal shapes). In this case, the peak portion of the connection portion according to the example of the present disclosure has a sharp structure (or a sharp portion) and the peak portion of the light emitting layer has a convex curved shape (or an uplifted portion ELa). In the example of the present disclosure, it may be ascertained that, since the peak portion of the connection portion and the peak portion of the light emitting layer have different shapes, the first effective emission area EA1 is provided in the light emitting element ED provided over the connection portion, the light emitted from the first effective emission area EA1 is totally reflected and propagates to the sharp peak portion of the connection portion in the light emitting element ED, is then reflected by the uplifted portion ELa with a convex curved shape of the light emitting layer, and is extracted to the substrate. In this case, it may be ascertained in the example of the present disclosure that most of light propagating between the peak portion of the connection portion and the uplifted portion of the light emitting layer is extracted to the substrate. Accordingly, since the light emitting display device according to the example of the present disclosure includes a light emitting layer having a contour which does not conform to the contour of the connection portions formed in the opening area in each pixel, it is possible to enhance the external extraction efficiency of light.

Figure 15A:
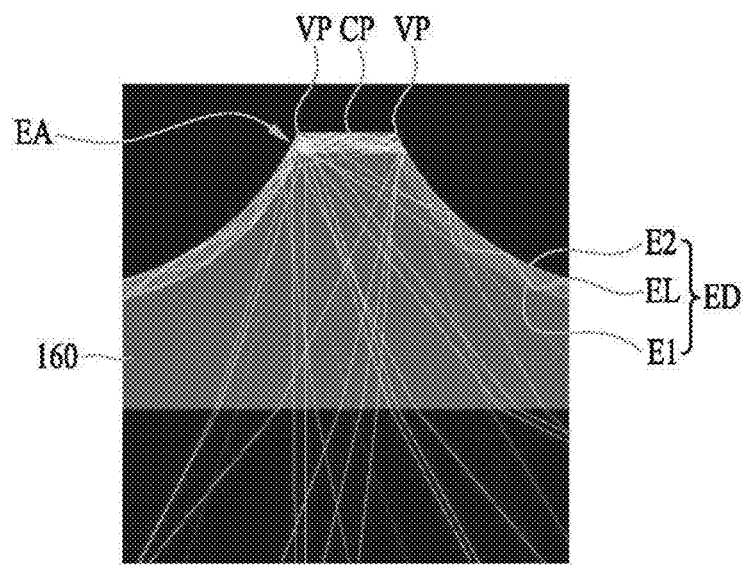
FIG. 15A is a simulation diagram illustrating an optical path corresponding to shapes of a vertex portion and a light emitting layer according to a comparative example.
Figure 15B:
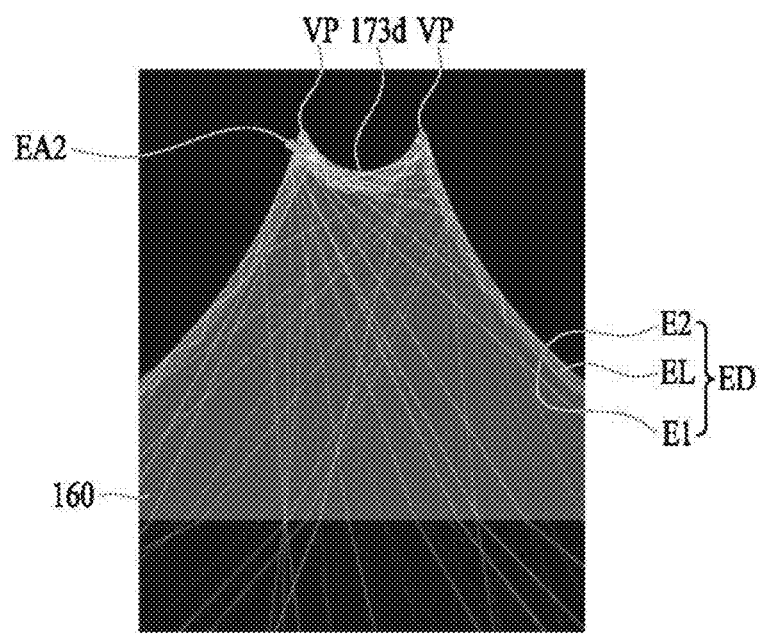
FIG. 15B is a simulation diagram illustrating an optical path corresponding to shapes of a vertex portion and a light emitting layer according to the embodiment of the present disclosure.

FIG. 15A is a simulation diagram illustrating an optical path corresponding to shapes of a vertex portion and a light emitting layer according to a comparative example. FIG. 15B is a simulation diagram illustrating an optical path corresponding to shapes of a vertex portion and a light emitting layer according to an example of the present disclosure.

Referring to FIG. 15A, in a comparative example, the vertex portions VP are formed such that the connection portions CP have the same height, and the light emitting layer EL of the light emitting element ED has a contour which conforms to the contour of the vertex portions VP and the connection portions CP. Accordingly, in the comparative example, a ridge portion between two neighboring vertex portions is formed to be flat. In the comparative example, it may be seen that, since a ridge portion between two neighboring vertex portions VP has a straight line (or planar) shape which is not concave, waveguides are formed between the two neighboring vertex portions VP, light emitted from the emission areas EA over the vertex portions VP does not propagate to the substrate, is repeatedly totally reflected, and is trapped in the light emitting element ED, whereby light extraction efficiency decreases.

Referring to FIG. 15B, in an example of the present disclosure, a vertex portion VP has a greater height than a connection portion VP, and the light emitting layer EL of the light emitting element ED provided over the vertex portion VP has a contour which does not conform to the contours of the vertex portion VP and the connection portion CP. Accordingly, in the example of the present disclosure, a ridge portion between two neighboring vertex portions VP is formed in a concave curved shape. In the example of the present disclosure, since a ridge portion between two neighboring vertex portions VP has a concave curved shape, it may be seen that most of light emitted from the emission area EA2 over the vertex portion VP is reflected and is extracted to the substrate. Accordingly, in the light emitting display device according to the example of the present disclosure, external extraction efficiency of light may be further enhanced due to additional external extraction of light from the vertex portions VP which are formed in the opening area of each pixel.

Figure 16A:
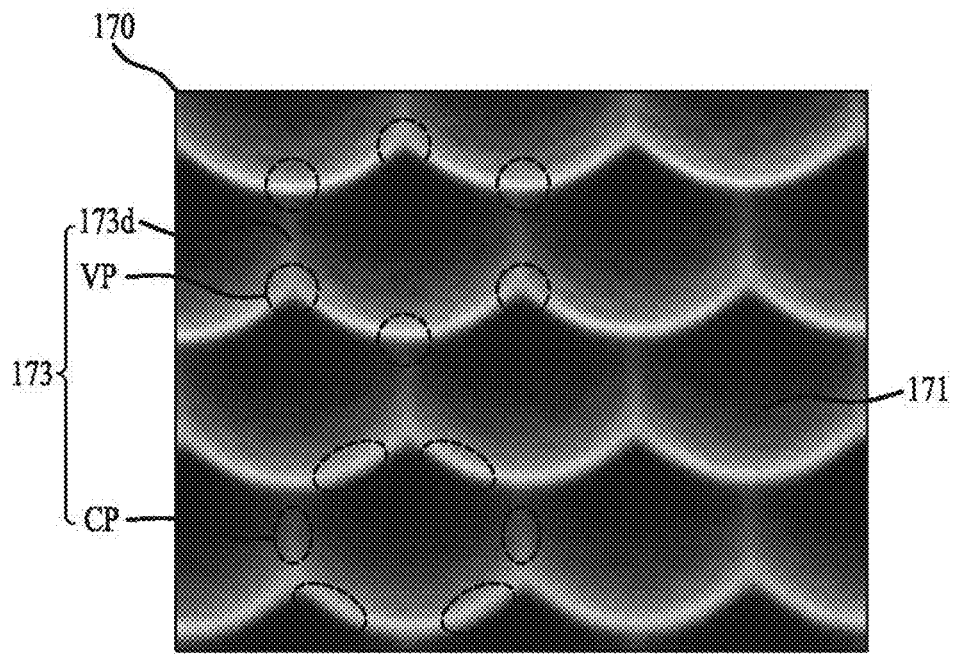
FIG. 16A is a microscope photograph of an uneven portion in the embodiment of the present disclosure.
Figure 16B:
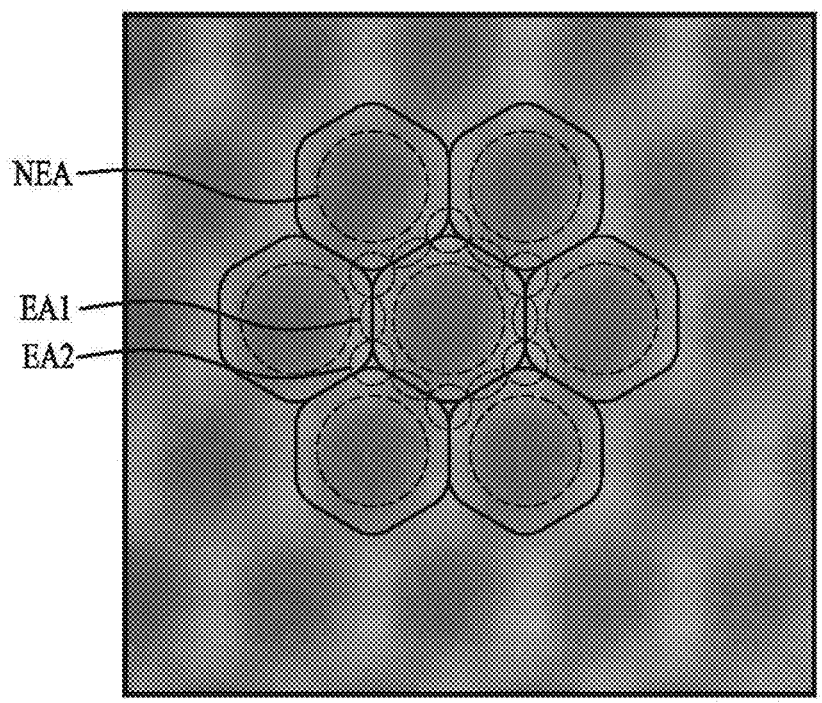
FIG. 16B is a photograph illustrating an actual emission image of pixels in the light emitting display device according to an example of the present disclosure.

FIG. 16A is a microscope photograph of an uneven portion in the light emitting display device according to an example of the present disclosure. FIG. 16B is a photograph illustrating an actual emission image of pixels in the light emitting display device according to an example of the present disclosure.

As may be seen from FIGS. 16A and 16B, the light emitting display device according to an example of the present disclosure includes a vertex portion VP having a sharp highest peak portion which is provided between three neighboring concave portions 171 and a connection portion CP having a sharp peak portion which is provided between two neighboring concave portions 171 in the uneven portion 170 and includes a light emitting layer which is formed non-conformal to the uneven portion 170. Accordingly, the opening area (or the uneven portion) of each pixel includes a non-effective emission area NEA which overlaps the concave portions 171, a first effective emission area EA1 which provided between two neighboring concave portions 171, and a second effective emission area EA2 which is provided between three neighboring concave portions 171 depending on the shape of the protruding portions 173. It may be ascertained that the effective emission areas EA1 and EA2 and the non-effective emission areas NEA in the light emitting element which are formed over the protruding portions 173 are displayed in an actual emission image. Particularly, as may be seen from an actual emission image, the second effective emission area EA2 which is formed over the vertex portion VP has luminance higher than that in the first effective emission area EA1 which is formed over the connection portion CP. Accordingly, with the light emitting display device according to the example of the present disclosure, external extraction efficiency of light may be further enhanced due to additional external extraction of light in vertex portions VP which are formed in the opening area of each pixel and areas between three neighboring concave portions 171.

The light emitting display device according to the present disclosure will be able to be described as follows.

A light emitting display device according to an example of the present disclosure includes: an uneven portion that is provided over a substrate and includes a plurality of concave portions separated from each other and protruding portions between the plurality of concave portions; and a light emitting element that is provided over the uneven portion. Each protruding portion includes: a vertex portion that is provided between three neighboring concave portions; and a connection portion that is connected to two neighboring vertex portions between two neighboring concave portions and has a height less than that of the vertex portions.

In the light emitting display device according to an example of the present disclosure, each protruding portion may further include a ridge portion that is provided to be concave between two neighboring vertex portions.

In the light emitting display device according to an example of the present disclosure, each vertex portion may include an upper portion that is located over an extension line extending from a bottom surface of the ridge portion, and the upper portion of the vertex portion may three-dimensionally have a triangular pyramid shape having concave side surfaces.

In the light emitting display device according to an example of the present disclosure, each vertex portion may include: a highest peak portion that has a sharp structure; an inclined surface that is provided between the highest peak portion and a bottom surface of the concave portion; and a ridge portion that is provided between the highest peak portion and the connection portion. The ridge portion may be provided to be concave between two neighboring vertex portions with the connection portion interposed therebetween.

In the light emitting display device according to an example of the present disclosure, an angle between the highest peak portion of the inclined surface and a ridge bottom surface of the ridge portion may be equal to or greater than 15 degrees and less than 75 degrees.

In the light emitting display device according to an example of the present disclosure, the highest peak portion of each vertex portion may have a first height from a bottom surface of the protruding portion and has a second height from a ridge bottom surface of the ridge portion, and a ratio of the first height to the second height may range from 0.1 to 0.3.

In the light emitting display device according to an example of the present disclosure, a ratio of the second height to a half distance of the ridge portion may range from 0.05 to 0.4, and the half distance of the ridge portion may be a half diameter between the highest peak portions of the two neighboring vertex portions.

In the light emitting display device according to an example of the present disclosure, a ratio of a distance of the ridge portion to two times a half-height width of the ridge portion may be greater than 0.625 and less than 1, the half-height width of the ridge portion may be a shortest distance between the ridge portions of the two neighboring vertex portions at a position of half the second height, and a distance of the ridge portion may be a diameter between the highest peak portions of the two neighboring vertex portions.

In the light emitting display device according to an example of the present disclosure, a ratio of the second height to a half-height width of the ridge portion may range from 0.05 to 0.25, and the half-height width of the ridge portion may be a shortest distance between the ridge portions of the two neighboring vertex portions at a position of half the second height.

In the light emitting display device according to an example of the present disclosure, the connection portion may include: a peak portion that has a sharp structure; and a curved portion that is provided between the peak portion and a bottom surface of the concave portion. A total height of the peak portion may be less than a total height of the vertex portion with respect to the bottom surface of the concave portion.

In the light emitting display device according to an example of the present disclosure, the light emitting element may include: a first electrode that is provided over the uneven portion; a light emitting layer that is provided over the first electrode; and a second electrode that is provided over the light emitting layer. The first electrode may have a contour which conforms to a contour of the uneven portion, and the light emitting layer may have a contour which does not conform to the contour of the uneven portion.

In the light emitting display device according to an example of the present disclosure, the light emitting layer may include a first uplifted portion that overlaps a peak portion of the connection portion, and the first uplifted portion may have a curved shape which is convex to cover (or to overlay) the peak portion of the connection portion.

In the light emitting display device according to an example of the present disclosure, the first uplifted portion may have a dome structure having an inflection portion.

In the light emitting display device according to an example of the present disclosure, the vertex portion may include a sharp portion, the light emitting layer may include a second uplifted portion that overlaps the sharp structure of the vertex portion, and the second uplifted portion may have a curved shape which is convex to cover (or to overlay) the sharp structure of the vertex portion.

In the light emitting display device according to an example of the present disclosure, a thickness of the light emitting layer may increase gradually toward the bottom portion of each of the plurality of concave portions.

In the light emitting display device according to an example of the present disclosure, the light emitting layer may include: a non-effective emission area that overlaps the bottom surface of each of the plurality of concave portions; a first effective emission area that is provided between two neighboring concave portions; and a second effective emission area that is provided between three neighboring concave portions and has luminance higher than that of the first effective emission area.

In the light emitting display device according to an example of the present disclosure, a ratio of a 4/5 height to a 4/5-height half width with respect to a total height of the connection portion may range from 0.35 to 0.6, the total height of the connection portion may be a height between the bottom surface of the protruding portion and the peak portion, and the 4/5-height half width may be a half width of the connection portion at a position of the 4/5 height.

In the light emitting display device according to an example of the present disclosure, a ratio of the total height to the half-height width of the connection portion may range from 0.45 to 0.7.

A light emitting display device according to an example of the present disclosure includes: a substrate that includes a plurality of pixels having an opening area; an uneven portion that is provided in the opening area and includes a plurality of concave portions separated from each other and protruding portions between the plurality of concave portions; and a light emitting element that is provided over the uneven portion. Each opening area includes: a non-effective emission area that overlaps a bottom surface of each of the plurality of concave portions; a first effective emission area that is provided between two neighboring concave portions; and a second effective emission area that is provided between three neighboring concave portions and has luminance higher than that of the first effective emission area.

In the light emitting display device according to an example of the present disclosure, each protruding portion may include: a vertex portion that is provided between three neighboring concave portions; and a connection portion that is connected to two neighboring vertex portions between two neighboring concave portions and has a height less than that of the vertex portions.

A light emitting display device according to an example of the present disclosure includes: a substrate that includes a plurality of pixels having an opening area; and an uneven portion that is provided in each opening area and includes a plurality of concave portions separated from each other and protruding portions surrounding the plurality of concave portions. Each protruding portion includes: a vertex portion that is provided between three neighboring concave portions; and a ridge portion that is concave between two neighboring vertex portions.

The light emitting display device according to an example of the present disclosure may further include a light emitting element that is provided over the uneven portion, and each opening area may include: a non-effective emission area that overlaps a bottom surface of each of the plurality of concave portions; a first effective emission area that overlaps the ridge portion; and a second effective emission area that overlaps the vertex portion.

In the light emitting display device according to an example of the present disclosure, the second effective emission area may have luminance higher than that of the first effective emission area.

In the light emitting display device according to an example of the present disclosure, each vertex portion may have a triangular pyramid shape having concave side surfaces.

In the light emitting display device according to an example of the present disclosure, the protruding portions may two-dimensionally have a honeycomb structure.

The light emitting display device according to an example of the present disclosure may further include an overcoat layer disposed over an emissive area and a non-emissive area of the substrate and having the uneven portion; a bank pattern disposed over the overcoat layer in the non-emissive area, and a color filter disposed between the substrate and the overcoat layer in emissive area.

In the light emitting display device according to an example of the present disclosure, an edge of the color filter may be extended beyond an edge of the uneven portion toward the non-emissive area, or an edge of the color filter, an edge of the uneven portion, and an edge of the bank pattern may overlap each other in the non-emissive area, or the bank pattern may overlay an edge of the uneven portion.

The light emitting display device according to an example of the present disclosure may further include an overcoat layer disposed over an emissive area and a non-emissive area of the substrate and having the uneven portion, a boundary between the emissive area and the non-emissive area may overlap with a portion of the uneven portion.

In the light emitting display device according to an example of the present disclosure, in a sectional view of the light emitting display device, the plurality of concave portions may be arranged in a line along a horizontal direction and staggered along a direction vertical to the sectional view.

In the light emitting display device according to an example of the present disclosure, the protruding portions may have a hexagonal shape or a honeycomb structure in plan view.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that the present disclosure is not limited to the above-mentioned embodiments and the accompanying drawings and various replacements, modifications, and variations may be made in the present disclosure without departing from the spirit or scope of the disclosures. Thus, it is construed that the scope of the present disclosure is defined by the appended claims, and the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:
a substrate;
an uneven portion over the substrate, the uneven portion including a plurality of concave portions separated from each other and having protruding portions between the plurality of concave portions, each protruding portion including:
    a vertex portion between three neighboring concave portions; and
    a connection portion connecting two neighboring vertex portions that are between two neighboring concave portions, the connection portion having a height less than that of the vertex portions; and
a light emitting element over the uneven portion.

2. The light emitting display device according to claim 1, wherein each protruding portion further includes a ridge portion that is concave between two neighboring vertex portions.

3. The light emitting display device according to claim 2, wherein each vertex portion includes an upper side portion located over an extension line extending from a bottom surface of the ridge portion, with respect to the height of the vertex portion, and
    wherein the upper side portion of the vertex portion three-dimensionally has a triangular pyramid shape having concave side surfaces.

4. The light emitting display device according to claim 1, wherein each vertex portion includes:
    a highest peak portion having a sharp structure;
    an inclined surface between the highest peak portion and a bottom surface of the concave portion; and
    a ridge portion between the highest peak portion and the connection portion, wherein the ridge portion is concave between two neighboring vertex portions with the connection portion interposed therebetween.

5. The light emitting display device according to claim 4, wherein an angle between the highest peak portion and a ridge bottom surface of the ridge portion is equal to or greater than 15 degrees and less than 75 degrees.

6. The light emitting display device according to claim 4, wherein the highest peak portion of each vertex portion has a first height from a bottom surface of the protruding portion and has a second height from a ridge bottom surface of the ridge portion, and wherein a ratio of the first height to the second height ranges from 0.1 to 0.3.

7. The light emitting display device according to claim 4, wherein the highest peak portion of each vertex portion has a second height from a ridge bottom surface of the ridge portion, a ratio of the second height to a half distance of the ridge portion ranges from 0.05 to 0.4, and
    wherein the half distance of the ridge portion is a half diameter between the highest peak portions of the two neighboring vertex portions.

8. The light emitting display device according to claim 4, wherein the highest peak portion of each vertex portion has a second height from a ridge bottom surface of the ridge portion, a ratio of a distance of the ridge portion to two times a half-height width of the ridge portion is greater than 0.625 and less than 1,
    wherein the half-height width of the ridge portion is a shortest distance between the ridge portions of the two neighboring vertex portions at a position of half the second height, and
    wherein a distance of the ridge portion is a diameter between the highest peak portions of the two neighboring vertex portions.

9. The light emitting display device according to claim 4, wherein the highest peak portion of each vertex portion has a second height from a ridge bottom surface of the ridge portion, a ratio of the second height to a half-height width of the ridge portion ranges from 0.05 to 0.25, and
    wherein the half-height width of the ridge portion is a shortest distance between the ridge portions of the two neighboring vertex portions at a position of half the second height.

10. The light emitting display device according to claim 1, wherein the connection portion includes:
    a peak portion; and
    a curved portion between the peak portion and a bottom surface of the concave portion, and
    wherein a total height of the peak portion is less than a total height of the vertex portion with respect to the bottom surface of the concave portion.

11. The light emitting display device according to claim 10, wherein the light emitting element includes:
    a first electrode over the uneven portion;
    a light emitting layer over the first electrode; and
    a second electrode over the light emitting layer,
    wherein the first electrode has a contour which conforms to a contour of the uneven portion, and
    wherein the light emitting layer has a contour which does not conform to the contour of the uneven portion.

12. The light emitting display device according to claim 11, wherein the light emitting layer includes at least one of a first uplifted portion that overlaps a peak portion of the connection portion, and a second uplifted portion that overlaps the vertex portion, wherein the first uplifted portion has a curved shape which is convex to overlay the peak portion of the connection portion,
wherein the second uplifted portion has a curved shape which is convex to overlay the vertex portion,
wherein the first uplifted portion has a dome structure having an inflection portion, and
wherein the second uplifted portion includes a dome or bell structure having a convex sectional shape.

13. The light emitting display device according to claim 11, wherein a thickness of the light emitting layer increases gradually toward the bottom portion of each of the plurality of concave portions.

14. The light emitting display device according to claim 13, wherein the light emitting layer includes:
a non-effective emission area overlapping the bottom surface of each of the plurality of concave portions;
a first effective emission area positioned between two neighboring concave portions; and
a second effective emission area positioned between three neighboring concave portions and has luminance higher than that of the first effective emission area.

15. The light emitting display device according to claim 10, wherein the curved portions of the connection portion has a tangent slope which decreases gradually from the peak portion to the bottom surface of the concave portion.

16. The light emitting display device according to claim 10, wherein a ratio of a 4/5 height to a 4/5-height half width with respect to a total height of the connection portion ranges from 0.35 to 0.6, the total height of the connection portion is a height between the bottom surface of the protruding portion and the peak portion, and the 4/5-height half width is a half width of the connection portion at a position of the 4/5 height, or
wherein a ratio of the total height to a half-height width of the connection portion ranges from 0.45 to 0.7, the total height of the connection portion is a height between the bottom surface of the protruding portion and the peak portion, and the half-height width is a width of a bottom surface of the connection portion at a position of a half of the total height.

17. The light emitting display device of claim 1, further comprising:
an overcoat layer disposed over an emissive area and a non-emissive area of the substrate and having the uneven portion;
a bank pattern disposed over the overcoat layer in the non-emissive area, and
a color filter disposed between the substrate and the overcoat layer in emissive area.

18. The light emitting display device of claim 17, wherein an edge of the color filter is extended beyond an edge of the uneven portion toward the non-emissive area, or
wherein an edge of the color filter, an edge of the uneven portion, and an edge of the bank pattern overlap each other in the non-emissive area, or
wherein the bank pattern overlays an edge of the uneven portion.

19. The light emitting display device of claim 1, further comprising an overcoat layer disposed over a emissive area and a non-emissive area of the substrate and having the uneven portion,
wherein a boundary between the emissive area and the non-emissive area overlaps with a portion of the uneven portion.

20. The light emitting display device of claim 1, wherein in a sectional view of the light emitting display device, the plurality of concave portions are arranged in a line along a horizontal direction and staggered along a direction vertical to the sectional view.

21. The light emitting display device of claim 1, wherein each of the protruding portions has a hexagonal shape or a honeycomb structure in a plan view.

22. A light emitting display device, comprising:
a substrate including a plurality of pixels having an opening area;
an uneven portion in the opening area and including a plurality of concave portions separated from each other and protruding portions between the plurality of concave portions, each opening area including:
a non-effective emission area overlapping a bottom surface of each of the plurality of concave portions;
a first effective emission area between two neighboring concave portions; and
a second effective emission area between three neighboring concave portions and has luminance higher than that of the first effective emission area; and
a light emitting element over the uneven portion.

23. The light emitting display device according to claim 22, wherein each protruding portion includes:
a vertex portion between three neighboring concave portions; and
a connection portion connected to two neighboring vertex portions between two neighboring concave portions and having a height less than that of the vertex portions.

24. The light emitting display device according to claim 22, wherein a thickness of the non-effective emission area is larger than a thickness of the first effective emission area, and the thickness of the first effective emission area is larger than a thickness of the second effective emission area.

25. A light emitting display device, comprising:
a substrate including a plurality of pixels having an opening area;
an uneven portion in each opening area and including a plurality of concave portions separated from each other and a protruding portion surrounding the plurality of concave portions, the protruding portion including a vertex portion between three neighboring concave portions, and a ridge portion that is concave between two neighboring vertex portions; and
a light emitting element over the uneven portion,
wherein each opening area includes:
a non-effective emission area overlapping a bottom surface of each of the plurality of concave portions;
a first effective emission area overlapping the ridge portion; and
a second effective emission area overlapping the vertex portion, and
wherein a thickness of the non-effective emission area is greater than a thickness of the first effective emission area, and the thickness of the first effective emission area is greater than a thickness of the second effective emission area.

26. The light emitting display device according to claim 25, wherein the second effective emission area has luminance higher than that of the first effective emission area.

* * * * *